(12) United States Patent
Chiu et al.

(10) Patent No.: US 12,101,922 B2
(45) Date of Patent: Sep. 24, 2024

(54) MEMORY DEVICE AND LAYOUT, MANUFACTURING METHOD OF THE SAME

(71) Applicant: Taiwan Semiconductor Manufacturing Company, Ltd., Hsinchu (TW)

(72) Inventors: Te-Hsin Chiu, Miaoli County (TW); Jiann-Tyng Tzeng, Hsin Chu (TW); Shih-Wei Peng, Hsinchu (TW); Wei-An Lai, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/340,900

(22) Filed: Jun. 26, 2023

(65) Prior Publication Data

US 2023/0354572 A1 Nov. 2, 2023

Related U.S. Application Data

(63) Continuation of application No. 17/075,704, filed on Oct. 21, 2020, now Pat. No. 11,737,254.

(51) Int. Cl.
*H10B 10/00* (2023.01)
*G11C 5/02* (2006.01)
*G11C 11/412* (2006.01)
*H01L 27/092* (2006.01)

(52) U.S. Cl.
CPC ............. *H10B 10/12* (2023.02); *G11C 5/025* (2013.01); *G11C 11/412* (2013.01); *H01L 27/092* (2013.01)

(58) Field of Classification Search
CPC ..................................................... H10B 10/12
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |

(Continued)

*Primary Examiner* — Walter H Swanson
(74) *Attorney, Agent, or Firm* — JCIPRNET

(57) ABSTRACT

A memory device is provided. The memory device includes first and second pull-up transistors. The first pull-up transistor is disposed over a semiconductor substrate, and including a first gate structure and two first source/drain structures at opposite sides of the first gate structure. The second pull-up transistor is laterally spaced apart from the first pull-up transistor, and including a second gate structure and two second source/drain structures at opposite sides of the second gate structure. The first and second gate structures extend along a first direction and laterally spaced apart from each other along a second direction intersected with the first direction. The first gate structure further extends along a sidewall of one of the second source/drain structures, and the second gate structure further extends along a sidewall of one of the first source/drain structures.

20 Claims, 12 Drawing Sheets

(56) References Cited

U.S. PATENT DOCUMENTS

| | | |
|---|---|---|
| 9,576,814 B2 | 2/2017 | Wu et al. |
| 9,608,116 B2 | 3/2017 | Ching et al. |
| 2017/0221905 A1* | 8/2017 | Chen ...................... H10B 10/18 |

* cited by examiner

MEMORY DEVICE AND LAYOUT, MANUFACTURING METHOD OF THE SAME

CROSS-REFERENCE TO RELATED APPLICATION

This application is a continuation application of and claims the priority benefit of a prior application Ser. No. 17/075,704, filed on Oct. 21, 2020, now allowed. The entirety of the above-mentioned patent application is hereby incorporated by reference herein and made a part of this specification.

BACKGROUND

The semiconductor industry has experienced rapid growth due to continuous improvement in the integration density of various electronic components (e.g., transistors, diodes, capacitors or the like). For the most part, the improvement in the integration density has come from repeated reductions in minimum feature size of the electronic components. However, as geometries have continued to shrink, dimensions of certain features (e.g., gate structures of transistors) may be less than ten atomic layers. Consequently, there is a physical limit to the degree of miniaturization.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
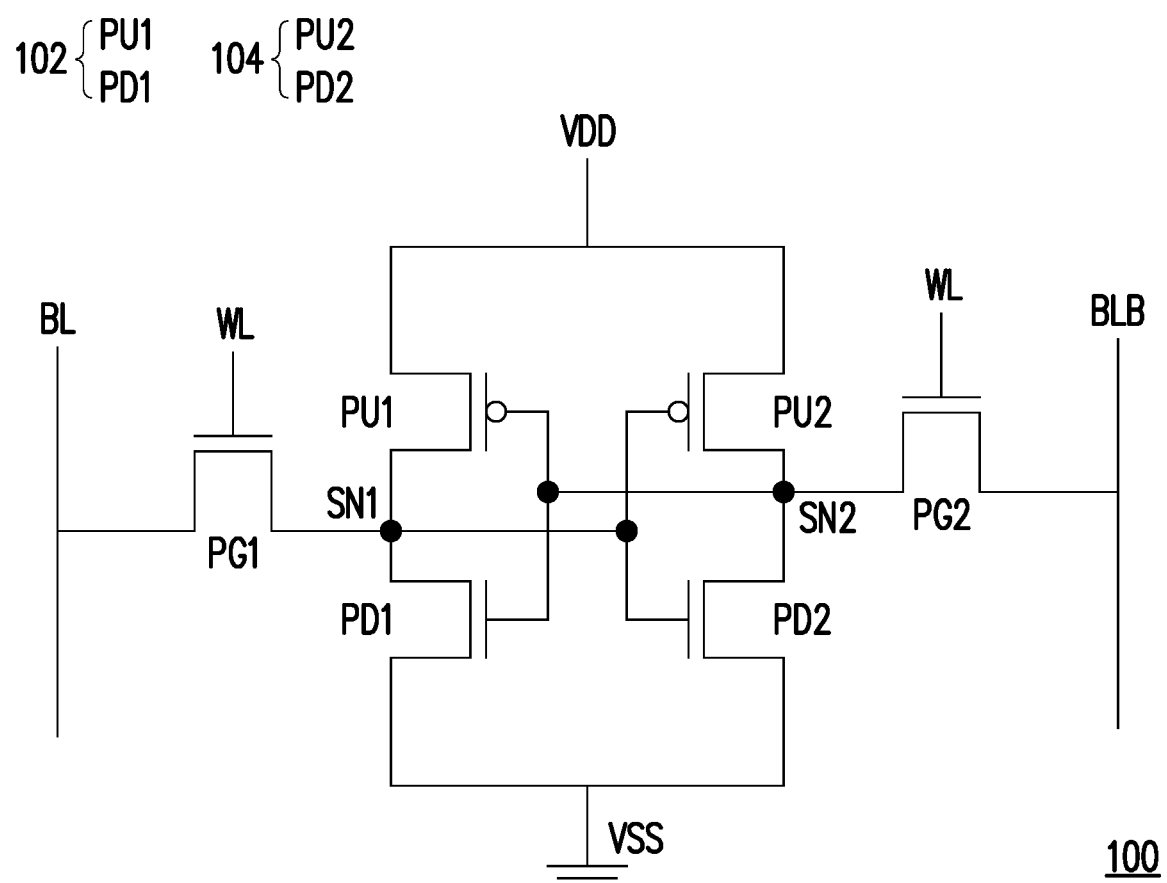
FIG. 1A is a circuit diagram illustrating a memory device according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a circuit diagram illustrating a memory device 100 according to some embodiments of the present disclosure.

Referring to FIG. 1A, in some embodiments, the memory device 100 is a memory cell in a static random access memory (SRAM) array. In these embodiments, the memory device 100 may be a single port SRAM cell. The memory device 100 may include pass-gate transistors PG1, PG2, pull-up transistors PU1, PU2 and pull-down transistors PD1, PD2. The pass-gate transistors PG1, PG2 and the pull-down transistors PD1, PD2 may have a first conductive type (e.g., N-type), while the pull-up transistors PU1, PU2 may have a second conductive type (e.g., P-type) complementary to the first conductive type (e.g., N-type).

Gate terminals of the pass-gate transistors PG1, PG2 are coupled to a word line WL, such that the pass-gate transistors PG1, PG2 can be controlled by the word line WL. Whether the memory device 100 is selected during a programming operation or a read operation may be determined by whether the pass-gate transistors PG1, PG2 are switched on. A latch circuit formed of the pull-up transistors PU1, PU2 and the pull-down transistors PD1, PD2 is coupled between the pass-gate transistors PG1, PG2, and is functioned to store a data bit. Complementary values of the data bit are stored in storage nodes SN1, SN2 of the latch circuit that are coupled to the pass-gate transistors PG1, PG2. The stored data bit can be written into, or read from the memory device 100 through a bit line BL and a bit line bar BLB that carry complementary signals. Source and drain terminals of the pass-gate transistor PG1 may be coupled to the bit line BL and the storage node SN1, whereas source and drain terminals of the pass-gate transistor PG2 may be coupled to the bit line bar BLB and the storage node SN2. Further, the latch circuit is coupled between a power supply voltage VDD and a reference voltage VSS.

In some embodiments, source terminals of the pull-up transistors PU1, PU2 are coupled to the power supply voltage VDD, while source terminals of the pull-down transistors PD1, PD2 are coupled to the reference voltage VSS. Further, drain terminals of the pull-up transistor PU1 and the pull-down transistor PD1 as well as gate terminals of the pull-up transistor PU2 and the pull-down transistor PD2 may be coupled to the storage node SN1. On the other hand, drain terminals of the pull-up transistor PU2 and the pull-down transistor PD2 as well as gate terminals of the pull-up transistor PU1 and the pull-down transistor PD1 may be coupled to the storage node N2. Accordingly, a first inverter 102 formed of the pull-up transistor PU1 and the pull-down transistor PD1 is cross-coupled with a second inverter 104 formed of the pull-up transistor PU2 and the pull-down transistor PD2. That is, the first inverter 102 has an input coupled to an output of the second inverter 104, which may be the storage node SN2. Likewise, the second inverter 104 has an input connected to an output of the first inverter 102, which may be the storage node SN1. By employing the two cross-coupled inverters 102, 104, the memory device 100 can hold the data using the latch structure, so that the stored data will not be lost without applying a refresh cycle, as long as the power supply voltage VDD remains coupled to the latch circuit.

Figure 1B:
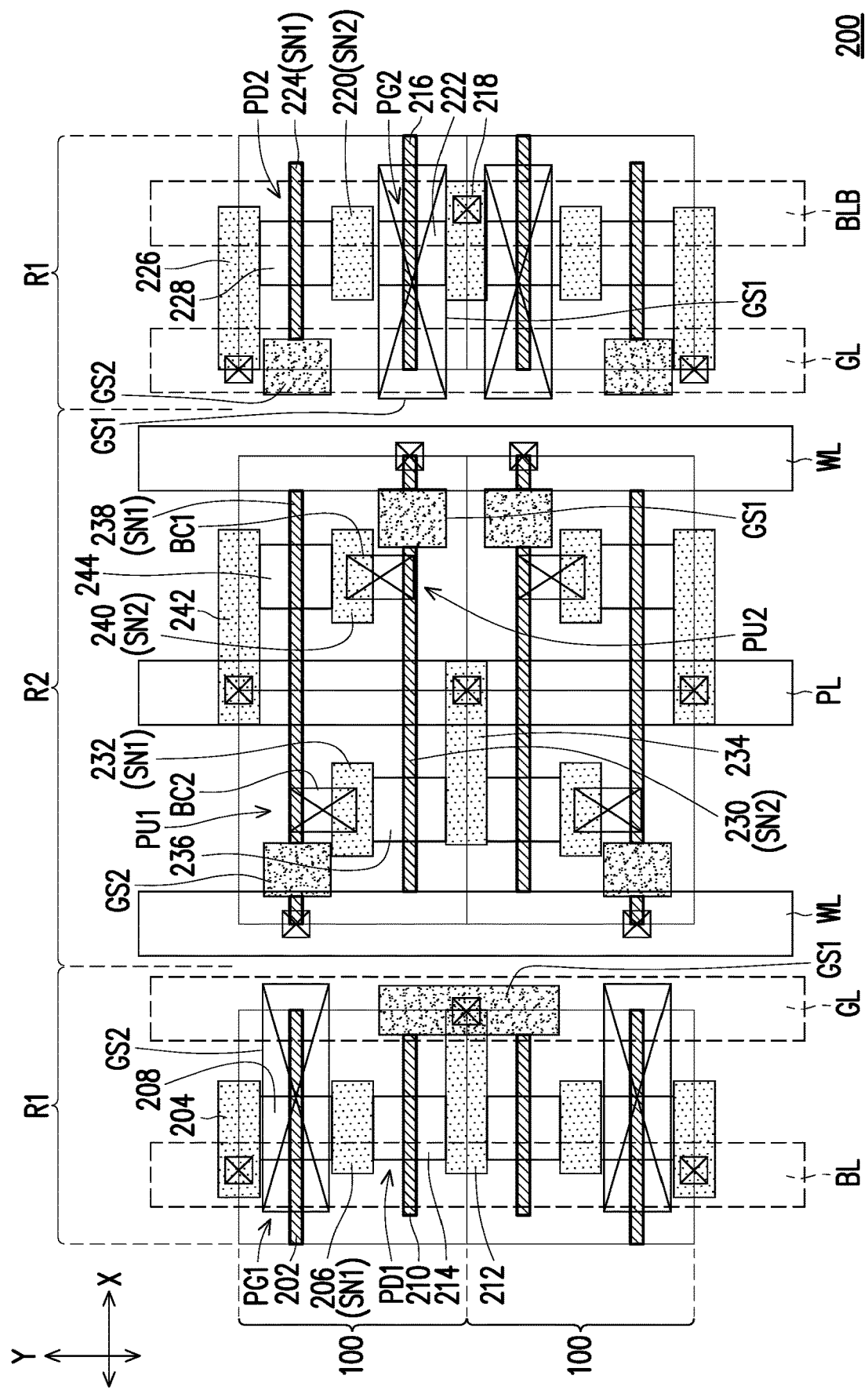
FIG. 1B illustrates a layout of adjacent memory devices (each represented by the circuit shown in FIG. 1A) according to some embodiments of the present disclosure.

FIG. 1B illustrates a layout 200 of two adjacent memory devices 100 (each represented by the circuit shown in FIG. 1A) according to some embodiments of the present disclosure.

Referring to FIG. 1A and FIG. 1B, the layout 200 of each memory device 100 has a first conductive type region R1 and a second conductive type region R2. The pass-gate transistors PG1, PG2 and the pull-down transistors PD1, PD2 may be formed within the first conductive type region R1, whereas the pull-up transistors PU1, PU2 may be formed within the second conductive type region R2. As will be described, the second conductive type region R2 may be located over and overlapped with the first conductive type region R1, such that a footprint area of each memory device 100 can be significantly reduced.

As shown in FIG. 1B, the pass-gate transistor PG1 is defined by a gate structure 202, a pair of source/drain structures 204, 206 and a channel structure 208 within the first conductive type region R1. The gate structure 202 extends in between the pair of source/drain structures 204, 206, and the channel structure 208 laterally penetrates through the gate structure 202 and connects with the pair of source/drain structures 204, 206. As will be further described, the gate structure 202 is coupled to the word line WL (also shown in FIG. 1A) lying over the second conductive type region R2. In addition, the source/drain structure 204 may be coupled to the bit line BL (also shown in FIG. 1A) lying below the first conductive type region R1, whereas the source/drain structure 206 may be coupled to the storage node SN1 (also shown in FIG. 1A). On the other hand, the pull-down transistor PD1 is defined by a gate structure 210, the source/drain structure 206, an additional source/drain structure 212 and a channel structure 214 within the first conductive type region R1. The gate structure 210 extends in between the source/drain structures 206, 212, and the channel structure 214 laterally penetrates through the gate structure 210 and connects with the source/drain structures 206, 212. As will be further described, the gate structure 210 of the pull-down transistor PD1 is connected with a gate structure of the pull-up transistor PU1 in the second conductive type region R2 (e.g., the gate structure 230). In addition, the source/drain structure 206 is shared by the pass-gate transistor PG1 and the pull-down transistor PD1, while the source/drain structure 212 may be coupled to a reference voltage line GL configured to receive the reference voltage VSS as shown in FIG. 1A. The reference voltage line GL may extend below the first conductive type region R1.

Similarly, the pass-gate transistor PG2 is defined by a gate structure 216, a pair of source/drain structures 218, 220 and a channel structure 222 within another portion of the first conductive type region R1. The gate structure 216 extends in between the pair of source/drain structures 218, 220, and the channel structure 222 laterally penetrates through the gate structure 216 and connects with the pair of source/drain structures 218, 220. As will be further described, the gate structure 216 is coupled to the word line WL (also shown in FIG. 1A) lying over the second conductive type region R2. In addition, the source/drain structure 218 may be coupled to the bit line bar BLB (also shown in FIG. 1A) lying below the first conductive type region R1, whereas the source/drain structure 220 may be coupled to the storage node SN2 (also shown in FIG. 1A). On the other hand, the pull-down transistor PD2 is defined by a gate structure 224, the source/drain structure 220, an additional source/drain structure 226 and a channel structure 228 within the first conductive type region R1. The gate structure 224 extends in between the source/drain structures 220, 226, and the channel structure 228 laterally penetrates through the gate structure 224 and connects with the source/drain structures 220, 226. As will be further described, the gate structure 224 is connected with a gate structure of the pull-up transistor PU2 in the second conductive type region R2 (e.g., the gate structure 238). In addition, the source/drain structure 220 is shared by the pass-gate transistor PG2 and the pull-down transistor PD2, while the source/drain structure 226 may be coupled to the reference voltage line GL configured to receive the reference voltage VSS as shown in FIG. 1A.

In the second conductive type region R2 above the first conductive type region R1, the pull-up transistor PU1 is defined by a gate structure 230, a pair of source/drain structures 232, 234 and a channel structure 236. The gate structure 230 extends in between the source/drain structures 232, 234, and the channel structure 236 laterally penetrates through the gate structure 230 and connects with the source/drain structures 232, 234. As will be further described, the gate structure 230 of the pull-up transistor PU1 is connected to the gate structure 210 of the pull-down transistor PD1, and is coupled to the storage node SN2. In addition, the source/drain structure 232 of the pull-up transistor PU1 is electrically connected to the common source/drain structure 206 of the pull-down transistor PD1 and the pass-gate transistor PG1, thus is coupled to the storage node SN1. Further, the source/drain structure 234 of the pull-up transistor PU1 is coupled to a power supply line PL lying above the second conductive type region R2 and configured to receive the power supply voltage VDD shown in FIG. 1A. On the other hand, the pull-up transistor PU2 is defined by a gate structure 238, a pair of source/drain structures 240, 242 and a channel structure 244. The gate structure 238 extends in between the source/drain structures 240, 242, and the channel structure 244 laterally penetrates through the gate structure 238 and connects with the source/drain structures 240, 242. As will be further described, the gate structure 238 of the pull-up transistor PU2 is connected to the gate structure 224 of the pull-down transistor PD2, and is coupled to the storage node SN1. In addition, the source/drain structure 240 of the pull-up transistor PU2 is electrically connected to the common source/drain structure 220 of the pass-gate transistor PG2 and the pull-down transistor PD2, and is coupled to the storage node SN2. Further the source/drain structure 242 of the pull-up transistor PU2 is coupled to the power supply line PL lying above the second conductive type region R2.

In some embodiments, the pull-up transistors PU1, PU2 are laterally spaced apart from each other along a direction X, and are offset from each other along a direction Y intersected with the direction X. In these embodiments, the source/drain structure 232 of the pull-up transistor PU1 and the source/drain structure 240 of the pull-up transistor PU2 may be located between the gate structures 230, 238 of the pull-up transistors PU1, PU2, while the source/drain structure 234 of the pull-up transistor PU1 and the source/drain structure 242 of the pull-up transistor PU2 may be located outside a space between the gate structures 230, 238 of the pull-up transistors PU1, PU2. In addition, the gate structure 230 of the pull-up transistor PU1 may further extend to a vicinity of the pull-up transistor PU2 along the direction X. As shown in FIG. 1B, a portion of the gate structure 230 extends along a sidewall of the source/drain structure 240 of the pull-up transistor PU2. In this way, the source/drain structure 240 of the pull-up transistor PU2 may be electrically connected to the gate structure 230 of the pull-up transistor PU1 by a butted contact BC1 extending between the source/drain structure 240 and the further extended portion of the gate structure 230. Since the source/drain structure 240 of the pull-up transistor PU2 is coupled to the storage node SN2, the gate structure 230 of the pull-up transistor PU1 electrically connected to the source/drain structure 240 is also coupled to the storage node SN2. Accordingly, the gate structure 210 of the pull-down transistor PD1 within the first conductive type region R1 and connected to the gate structure 230 of the pull-up transistor PU1 (as will be further described) is coupled to the storage node SN2 as well. Further, the butted contact BC1 lies over the transistors (e.g., the pass-gate transistors PG1, PG2, the pull-down transistors PD1, PD2 and the pull-up transistors PU1, PU2) of the memory device 100 (as will be further described with reference to FIG. 2A), and extends along a single direction (e.g., the direction Y). In other words, the gate structure 230 of the pull-up transistor PU1 and the source/drain structure 240 of the pull-up transistor PU2 can be electrically connected with each other by further extending the gate structure 230 and disposing a single dimensional bridging component (e.g., the butted contact BC1 solely extending along the direction Y) in between.

Similarly, the gate structure 238 of the pull-up transistor PU2 may further extend to a vicinity of the pull-up transistor PU1 along the direction X. As shown in FIG. 1B, a portion of the gate structure 238 extends along a sidewall of the source/drain structure 232 of the pull-up transistor PU1. In this way, the source/drain structure 232 of the pull-up transistor PU1 may be electrically connected to the gate structure 238 of the pull-up transistor PU2 by a butted contact BC2 extending between the source/drain structure 232 and the further extended portion of the gate structure 238. Since the source/drain structure 232 of the pull-up transistor PU1 is coupled to the storage node SN1, the gate structure 238 of the pull-up transistor PU2 electrically connected to the source/drain structure 232 is also coupled to the storage node SN1. Accordingly, the gate structure 224 of the pull-down transistor PD2 within the first conductive type region R1 and connected to the gate structure 238 of the pull-up transistor PU2 (as will be further described) is coupled to the storage node SN1 as well. Further, the butted contact BC2 lies over the transistors (e.g., the pass-gate transistors PG1, PG2, the pull-down transistors PD1, PD2 and the pull-up transistors PU1, PU2) of the memory device 100 (as will be further described with reference to FIG. 3A through FIG. 3C), and extends along a single direction (e.g., the direction Y). In other words, the gate structure 238 of the pull-up transistor PU2 and the source/drain structure 232 of the pull-up transistor PU1 can be electrically connected with each other by further extending the gate structure 238 and disposing a single dimensional bridging component (e.g., the butted contact BC2 solely extending along the direction Y) in between.

As compared to a two dimensional bridging component, the single dimensional bridging component (i.e., the butted contact BC1/BC2) is easier to be precisely patterned by photolithography and etching processes. Further, the single dimensional bridging component may occupy a footprint area smaller than a footprint area of a two dimensional bridging component, and a larger area is available for disposing the signal lines (e.g., the word line WL and the power supply line PL) over the transistors (e.g., the pass-gate transistors PG1, PG2, the pull-down transistors PD1, PD2 and the pull-up transistors PU1, PU2) of the memory device 100. Further, in those embodiments where the bit line BL and the bit line bar BLB are disposed below the memory device 100 rather than above the memory device 100, deep vias may not be required for routing some of the bottom source/drain structures to top side of the memory device 100 for establishing electrical connection with the overlying bit line and bit line bar. According to the embodiments of the present application, short vias (e.g., the routing element 606 to be described with reference to FIG. 6B) may be available for routing these bottom source/drain structures (e.g., the source/drain structures 202, 218) to the bit line BL and the bit line bar BLB lying below the memory device 100. By using short vias instead of deep vias for establishing electrical conduction path between some of the bottom source/drain structures and the bit line BL as well as the bit line bar BLB, resistance/impedance along such conduction path can be effectively reduced. Accordingly, operation speed of the memory device 100 may be improved.

Figure 2A:
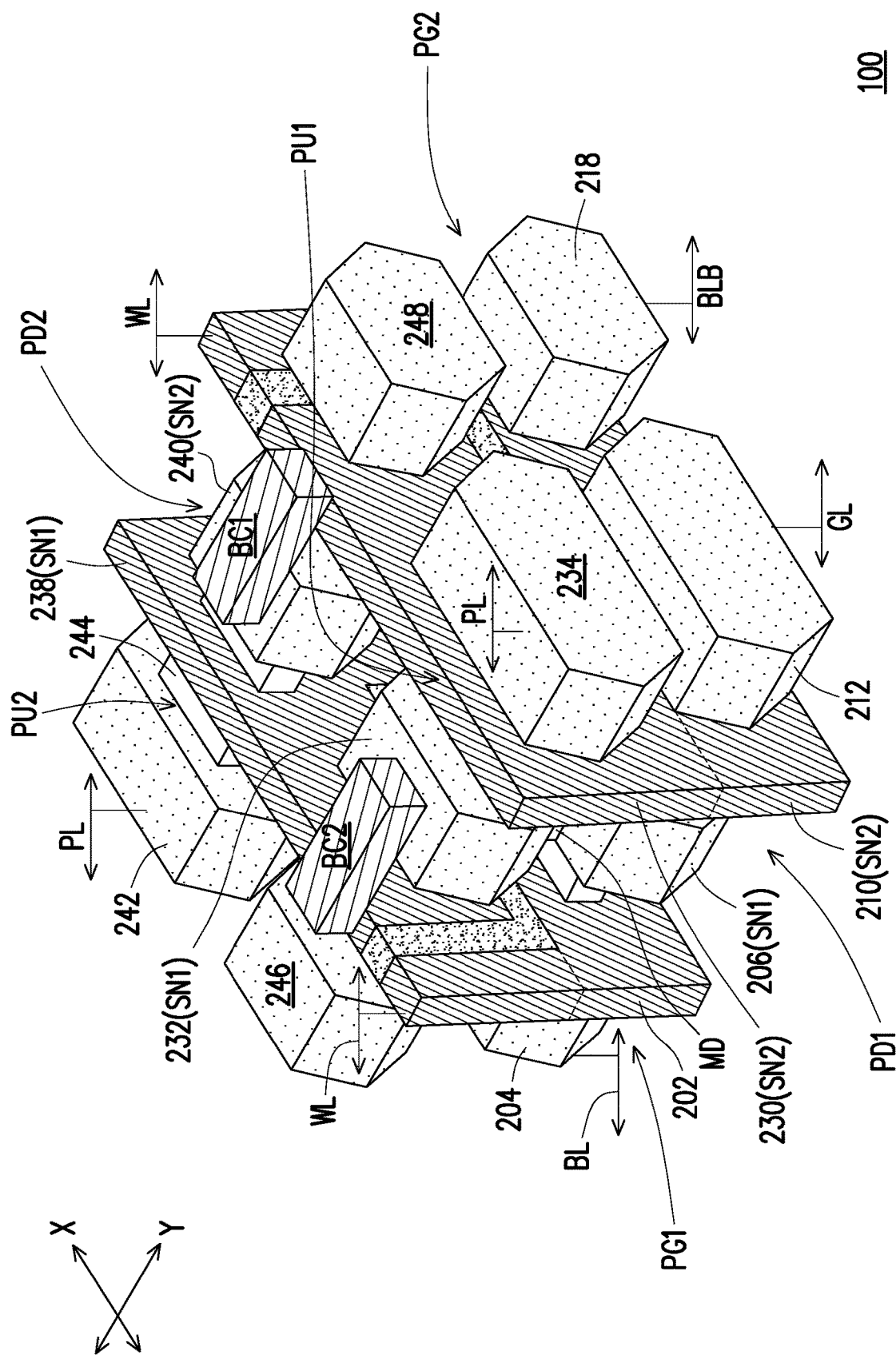
FIG. 2A is a schematic three-dimensional view illustrating a structure of the memory device (represented by the layout shown in FIG. 1B).
Figure 2B:
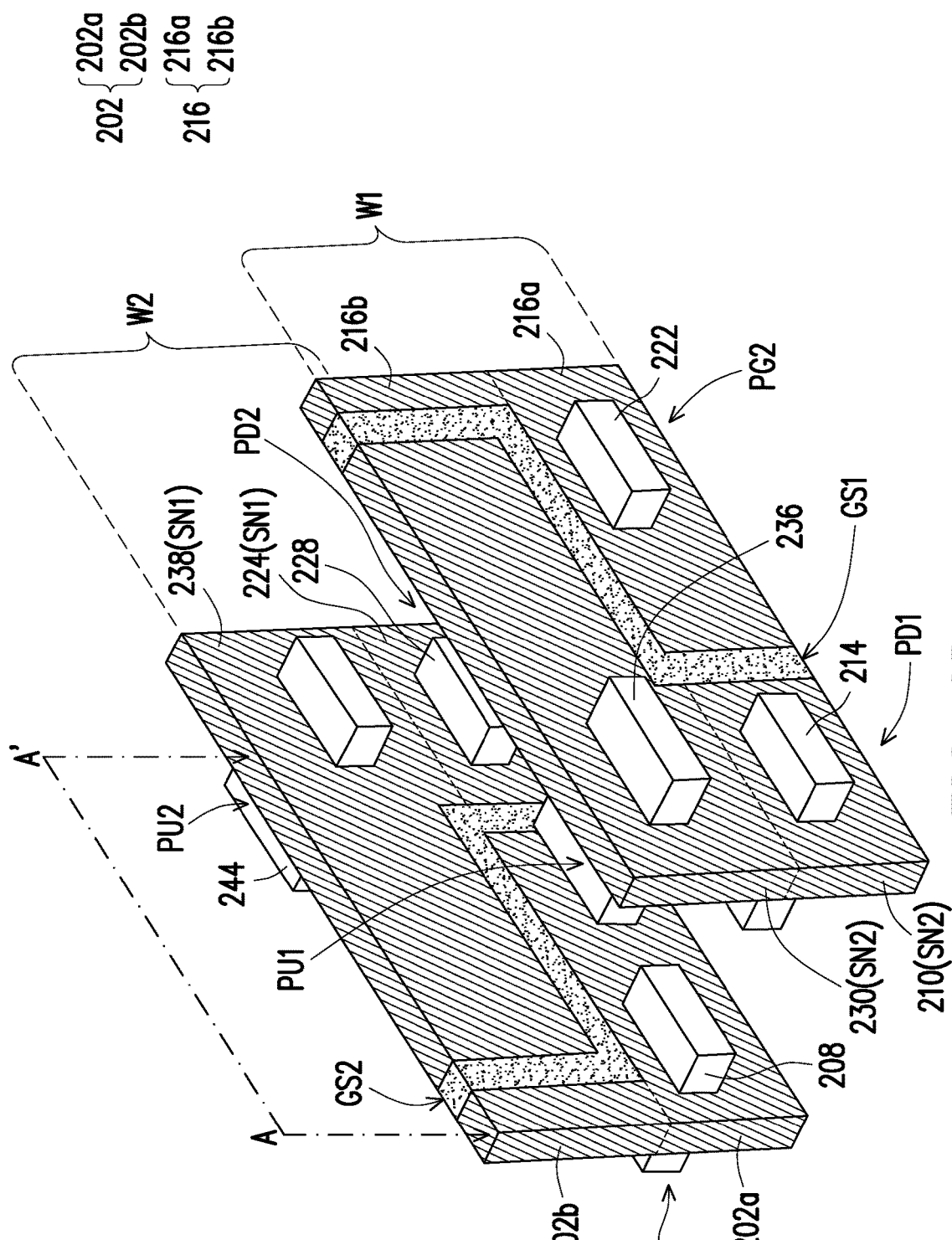
FIG. 2B is a schematic three-dimensional view illustrating some portions of the structure shown in FIG. 2A.

FIG. 2A is a schematic three-dimensional view illustrating a structure of the memory device 100 (represented by the circuit diagram of FIG. 1A and the layout 200 shown in FIG. 1B). FIG. 2B is a schematic three-dimensional view illustrating some portions of the structure shown in FIG. 2A. It should be noted that, for the purpose of illustration, the gate structures of the pull-down transistor PD1, the pass-gate transistor PG2 and the pull-up transistor PU1 are depicted as transparent in FIG. 2A.

Referring to FIG. 1B and FIG. 2A, as described above, the pass-gate transistors PG1, PG2 and the pull-down transistors PD1, PD2 are disposed within the first conductive type region R1 located below the pull-up transistors PU1, PU2 within the second conductive type region R2. Although not shown, the memory device 100 may be formed on a semiconductor substrate (e.g., a semiconductor wafer or a semiconductor-on-insulator wafer). A side of the semiconductor substrate at which the memory device 100 is formed may be referred as an active side or a front side, and the other side of the semiconductor substrate may be referred as a back side. As shown in FIG. 2A, the pass-gate transistor PG1 is arranged aside the pull-down transistor PD1, and is connected to the pull-down transistor PD1 by the common source/drain structure 206, which is coupled to the storage node SN1. In addition, the pass-gate transistor PG2 is arranged aside the pull-down transistor PD2 (mostly hidden in FIG. 2A), and is connected to the pull-down transistor PD2 through the common source/drain structure 220 (shown in FIG. 1B), which is coupled to the storage node SN2. In some embodiments, the pass-gate transistors PG1, PG2 and the pull-down transistors PD1, PD2 are arrange in a rectangular configuration. In these embodiments, the pull-down transistors PD1, PD2 may be arranged along a diagonal of the rectangular configuration, whereas the pass-gate transistors PG1, PG2 may be arranged along another diagonal of the rectangular configuration.

The pull-up transistors PU1, PU2 located within the second conductive type region R2 are stacked on the pull-down transistors PD1, PD2, respectively. In those embodiments where the pull-down transistors PD1, PD2 are arranged along a diagonal of the rectangular configuration of the pass-gate transistors PG1, PG2 and the pull-down transistors PD1, PD2, the pull-up transistors PU1, PU2 are arranged along the diagonal as well. The source/drain structure 232 of the pull-up transistor PU1 is electrically connected to the common source/drain structure 206 of the underlying pull-down transistor PD1 and pass-gate transistor PG1, and thus coupled to the storage node SN1. Similarly, the source/drain structure 240 of the pull-up transistor PU2 is electrically connected to the common source/drain structure 220 (shown in FIG. 1B) of the underlying pull-down transistor PD2 and pass-gate transistor PG2, and thus coupled to the storage node SN2. In some embodiments, the source/drain structure 232 is electrically connected to the underlying source/drain structure 206 though a conductive structure MD sandwiched between the source/drain structures 206, 232. Similarly, the source/drain structure 240 is electrically connected to the underlying source/drain structure 220 through a conductive structure (which is similar to the conductive structure MD, and not shown in FIG. 2A) sandwiched between the source/drain structures 220, 240. On the other hand, the source/drain structure 234 of the pull-up transistor PU1 is vertically spaced apart and isolated from the underlying source/drain structure 212 of the pull-down transistor PD1, and the source/drain structure 242 of the pull-up transistor PU2 is vertically spaced apart and isolated from the underlying source/drain structure 226 (shown in FIG. 1B).

The gate structure 238 of the pull-up transistor PU2 further extends to the vicinity of the pull-up transistor PU1, thus can be coupled to the storage node SN1 by electrically connecting to the source/drain structure 232 of the pull-up transistor PU1 through a single dimensional bridging component (i.e., the butted contact BC2). Similarly, the gate structure 230 of the pull-up transistor PU1 further extends to the vicinity of the pull-up transistor PU2, thus can be coupled to the storage node SN2 by electrically connecting to the source/drain structure 240 of the pull-up transistor PU2 through a single dimensional bridging component (i.e., the butted contact BC1). As shown in FIG. 2A, the butted contacts BC1, BC2 may be disposed above the pull-up transistor PU1, PU2. Further, as schematically illustrated in FIG. 2A, the power supply line PL and the word line WL lie over the pull-up transistors PU1, PU2. As described with reference to FIG. 1B, since the butted contact BC1 for connecting the gate structure 230 and the source/drain structure 240 as well as the butted contact BC2 for connecting the gate structure 238 and the source/drain structure 232 are single dimensional bridging components (i.e., the butted contacts BC1, BC2) rather than multiple dimensional bridging components, a smaller area is required for realizing such electrical connection. Accordingly, a larger area above the pull-up transistors PU1, PU2 can be provided for the word line WL and the power supply line PL. On the other hand, as also described with reference to FIG. 1B, the reference voltage line GL, the bit line BL and the bit line bar BLB lie below the pass-gate transistors PG1, PG2 and the pull-down transistors PD1, PD2. In those embodiments where the memory device 100 is formed on an active side (i.e., front side) of a semiconductor substrate (not shown), the word line WL and the power supply line PL may extend above the front surface of the semiconductor substrate, whereas the bit line BL, the bit line bar BLB and the reference voltage line GL may be routed to a back side of the semiconductor substrate that is facing away from the active side of the semiconductor substrate.

In some embodiments, the memory device 100 further includes dummy source/drain structures 246, 248 (shown in FIG. 2A, but not in FIG. 1B). The dummy source/drain structures 246, 248 are disposed over the pass-gate transistors PG1, PG2, respectively. The further extended portion of the gate structure 238 of the pull-up transistor PU2 may extend between the dummy source/drain structure 246 and the source/drain structure 232 of the pull-up transistor PU1. The further extended portion of the gate structure 238, the dummy source/drain structure 246 and the source/drain structure 232 may collectively form a dummy transistor. A channel structure may be absent in this dummy transistor, such that the dummy transistor may resemble a transistor in terms of structure, but may not have a switching function of a transistor. In addition, the dummy source/drain structure 246 is isolated from the gate structure 238. Similarly, the further extended portion of the gate structure 230 of the pull-up transistor PU1 may extend between the dummy source/drain structure 248 and the source/drain structure 240 of the pull-up transistor PU2. The further extended portion of the gate structure 230, the dummy source/drain structure 248 and the source/drain structure 240 may collectively form another dummy transistor. In addition, the dummy source/drain structure 248 is isolated from the gate structure 230.

Referring to FIG. 2A and FIG. 2B, the gate structure 230 of the pull-up transistor PU1, the gate structure 210 of the pull-down transistor PD1 and the gate structure 216 of the pass-gate transistor PG2 are portions of a wall structure W1, while the gate structure 238 of the pull-up transistor PU2, the gate structure 224 of the pull-down transistor PD2 and the gate structure 202 of the pass-gate transistor PG1 are portions of another wall structure W2. The wall structures W1, W2 extend along the direction X, and are spaced apart from each other along the direction Y. In addition, the wall structure W1 is laterally penetrated through by the channel structures 214, 222, 236 of the pull-down transistor PD1, the pass-gate transistor PG2 and the pull-up transistor PU1. Similarly, the wall structure W2 is laterally penetrated though by the channel structures 208, 228, 244 of the pass-gate transistor PG1, the pull-down transistor PD2 and the pull-up transistor PU2.

The gate structures 210, 216 of the wall structure W1 are laterally spaced apart and isolated from each other. The gate structure 230 (also in the wall structure W1) is stacked on the gate structures 210, 216, and electrically connected with the gate structure 210 but isolated from the gate structure 216. Accordingly, the gate structures 210, 216 of the pull-down transistor PD1 and the pass-gate transistor PG2 may be regarded as being at a ground level of the wall structure W1, while the gate structure 230 of the pull-up transistor PU1 may be regarded as being at an elevated level of the wall structure W1. As described with reference to FIG. 1B and FIG. 2A, the gate structure 216 of the pass-gate transistor PG2 is coupled to the word line WL (shown in FIG. 1B and FIG. 2A). In those embodiments where the word line WL lies above the memory device 100, the gate structure 216 of the pass-gate transistor PG2 may have a body portion 216a at the ground level of the wall structure W1, and have a protruding portion 216b protruding from the body portion 216a to a top surface of the wall structure W1, in order to be coupled to the overlying word line WL. In other words, the protruding portion 216b of the gate structure 216 extends from the ground level to a top side of the elevated level of the wall structure W1. In addition, the gate structure 216 may be formed in a "L" shape. On the other hand, as described with reference to FIG. 1B and FIG. 2A, the gate structures 210, 230 of the pull-down transistor PD1 and the pull-up transistor PU1 in the wall structure W1 are coupled to the storage node SN2, and are electrically isolated from the gate structure 216 of the pass-gate transistor PG2 that is coupled to the word line WL. In some embodiments, the gate structures 210, 230 are isolated from the gate structure 216 by an inter-gate isolation structure GS1. The inter-gate isolation structure GS1 may have two pillar portions and a laterally lying portion extending between the two pillar portions. One of the pillar portions of the inter-gate isolation structure GS1 stands between the gate structures 210 and the body portion 216a of the gate structure 216 at the ground level. The other one of the pillar portions of the inter-gate isolation structure GS1 stands on the body portion 216a of the gate structure 216, and is located between the gate structure 230 and the protruding portion 216b of the gate structure 216. Further, the laterally lying portion of the inter-gate isolation structure GS1 extends along a top surface of the body portion 216a of the gate structure 216, and is covered by the gate structure 230. The laterally lying portion of the inter-gate isolation structure GS1 may be regarded as being located in a topmost region of the ground level of the wall structure W1, wherein the pillar portion of the inter-gate isolation structure GS1 standing on the body portion 216a of the gate structure 216 may be regarded as extend from the ground level to top of the elevated level of the wall structure W1.

Similarly, the gate structures 202, 224 of the wall structure W2 are laterally spaced apart and isolated from each other. The gate structure 238 (also in the wall structure W2) is stacked on the gate structures 202, 224, and electrically connected with the gate structure 202 but isolated from the gate structure 224. Accordingly, the gate structures 202, 224 of the pass-gate transistor PG1 and the pull-down transistor PD2 may be regarded as being at a ground level of the wall structure W2, while the gate structure 238 of the pull-up transistor PU2 may be regarded as being at an elevated level of the wall structure W2. As described with reference to FIG. 1B and FIG. 2A, the gate structure 202 of the pass-gate transistor PG1 is coupled to the word line WL (shown in FIG. 1B and FIG. 2A). In those embodiments where the word line WL lies above the memory device 100, the gate structure 202 of the pass-gate transistor PG1 may have a body portion 202a at the ground level of the wall structure W2, and have a protruding portion 202b protruding from the body portion 202a to a top surface of the wall structure W2, in order to be coupled to the overlying word line WL. In other words, the protruding portion 202b of the gate structure 202 extends from the ground level to a top side of the elevated level of the wall structure W2. In addition, the gate structure 202 may be formed in a "L" shape. On the other hand, as described with reference to FIG. 1B and FIG. 2A, the gate structures 224, 238 of the pull-down transistor PD2 and the pull-up transistor PU2 in the wall structure W2 are coupled to the storage node SN1, and are electrically isolated from the gate structure 202 of the pass-gate transistor PG1 that is coupled to the word line WL. In some embodiments, the gate structures 224, 238 are isolated from the gate structure 202 by an inter-gate isolation structure GS2. The inter-gate isolation structure GS2 may have two pillar portions and a laterally lying portion extending between the two pillar portions. One of the pillar portions of the inter-gate isolation structure GS2 stands between the gate structures 224 and the body portion 202a of the gate structure 202 at the ground level. The other one of the pillar portions of the inter-gate isolation structure GS2 stands on the body portion 202a of the gate structure 202, and is located between the gate structure 238 and the protruding portion 202b of the gate structure 202. Further, the laterally lying portion of the inter-gate isolation structure GS2 extends along a top surface of the body portion 202a of the gate structure 202, and is covered by the gate structure 238. The laterally lying portion of the inter-gate isolation structure GS2 may be regarded as being located in a topmost region of the ground level of the wall structure W2, wherein the pillar portion of the inter-gate isolation structure GS2 standing on the body portion 202a of the gate structure 202 may be regarded as extend from the ground level to top of the elevated level of the wall structure W2.

It should be noted that, the inter-gate isolation structure GS1 is also illustrated in FIG. 1B, but is depicted as separated portions located within the first conductive type region R1 and the second conductive type region R2. As described with reference to FIG. 2B, the portions of the inter-gate isolation structure GS1 within the first conductive type region R1 (i.e., at the ground level) are functioned for isolating the body portion 216a of the gate structure 216 from the gate structures 210, 230. Further, the portion of the inter-gate isolation structure GS1 within the second conductive type region R2 (i.e., at the elevated level) is functioned for isolating the protruding portion 216b of the gate structure 216 from the gate structure 230. Similarly, the inter-gate isolation structure GS2 shown in FIG. 1B has portions located within the first conductive type region R1 and the second conductive type region R2. As described with reference to FIG. 2B, the portions of the inter-gate isolation structure GS2 within the first conductive type region R1 (i.e., at the ground level) are functioned for isolating the body portion 202a of the gate structure 202 from the gate structures 224, 238. Further, the portion of the inter-gate isolation structure GS1 within the second conductive type region R2 (i.e., at the elevated level) is functioned for isolating the protruding portion 202b of the gate structure 202 from the gate structure 238.

By disposing the inter-gate isolation structure GS1, a portion of the wall structure W1 that is coupled to the storage node SN2 can be isolated from another portion of the wall structure W1 that is coupled to the word line WL. Similarly, by disposing the inter-gate isolation structure GS2, a portion of the wall structure W2 that is coupled to the storage node SN1 can be isolated from another portion of the wall structure W2 that is coupled to the word line WL. In other words, by disposing the inter-gate isolation structure GS1/GS2, gate structures coupled to different signals can be integrated in the same wall structure W1/W2.

Figure 3:
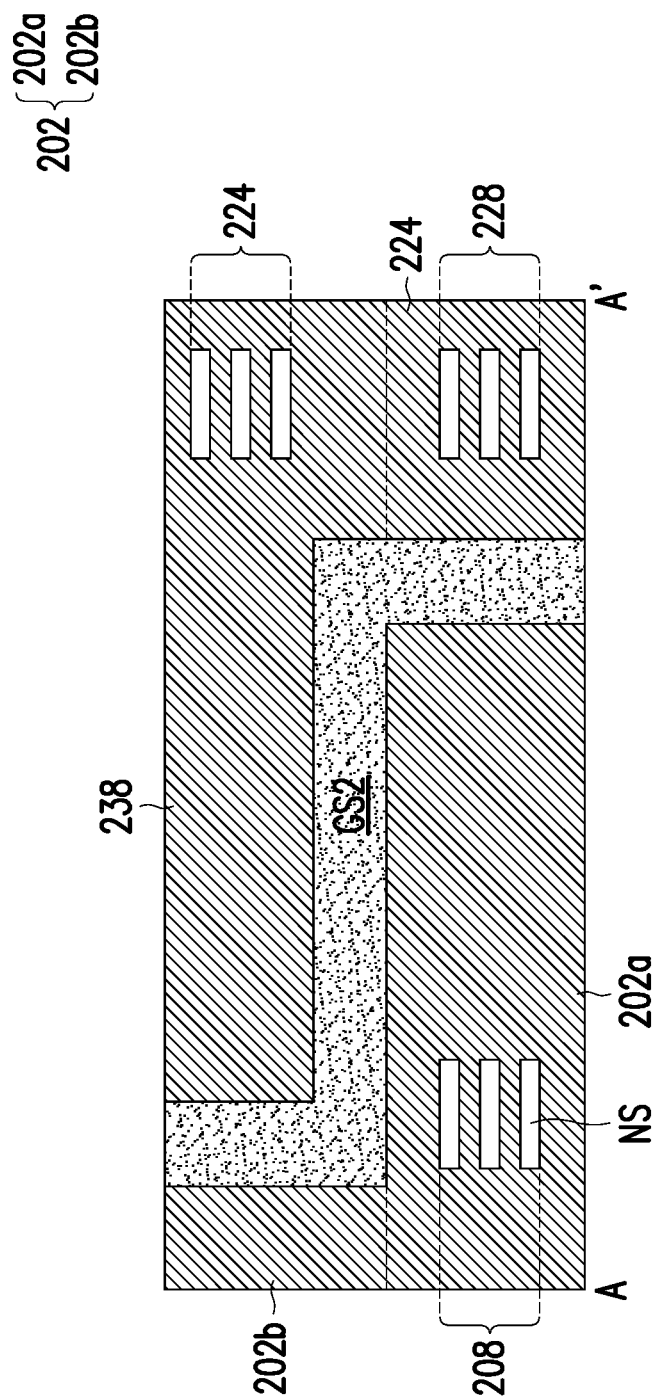
FIG. 3 is a schematic cross-sectional view along line A-A' shown in FIG. 2B.

FIG. 3 is a schematic cross-sectional view along line A-A' shown in FIG. 2B.

Referring to FIG. 2B and FIG. 3, in some embodiments, the pass-gate transistors PG1, PG2, the pull-down transistors PD1, PD2 and the pull-up transistors PU1, PU2 are gate-all-around (GAA) transistors. In these embodiments, the channel structures 208, 222, 214, 228, 236, 244 of these transistors may respectively include a stack of semiconductor sheets/wires NS. Taking the channel structures 208, 228, 244 penetrating through the wall structure W2 shown in FIG. 3 as examples, the semiconductor sheets/wires NS of each transistor are stacked along a vertical direction, and are vertically spaced apart from one another. In this way, each of the semiconductor sheets/wires NS can be wrapped by the corresponding gate structure. For example, each of the semiconductor sheets/wires NS of the channel structure 208 is wrapped by the body portion 202a of the gate structure 202, each of the semiconductor sheets/wires NS of the channel structure 228 is wrapped by the gate structure 224, and each of the semiconductor sheets/wires NS of the channel structure 244 is wrapped by the gate structure 238. Those skilled in the art may adjust the amount of the semiconductor sheets/wires NS of each channel structure according to process and/or design requirements, the present disclosure is not limited thereto. Further, a conductive type of the semiconductor sheets/wires NS of an N-type transistor (e.g., one of the pull-down transistors PD1, PD2 and the pass-gate transistors PG1, PG2) may be complementary to the semiconductor sheets/wires NS of a P-type transistor (e.g., one of the pull-up transistors PU1, PU2). For instance, the semiconductor sheets/wires NS of the N-type transistor may be P-type, while the semiconductor sheets/wires NS of the P-type transistor may be N-type. In some embodiments, a base material of the semiconductor sheets/wires NS includes silicon or a composite semiconductor (e.g., GaAs, InP, GaN or the like). In addition, gate dielectric layers (not shown) may be formed between the semiconductor sheets/wires NS and the gate structures.

In some embodiments, a method for forming the GAA transistors may include forming stacks of semiconductor sheets/wires and sacrificial layers on a semiconductor substrate. The semiconductor sheets/wires and the sacrificial layers of each stack are alternately stacked on the semiconductor substrate. Thereafter, initial wall structures intersected with the stacks are formed on the semiconductor substrate, and portions of the stacks not covered by the initial wall structures are removed. The initial wall structures may include sacrificial gate structures to be replaced by the gate structures (i.e., the gate structures 210, 230, 216, 202, 224, 238 shown in FIG. 2B), and may include the inter-gate isolation structures (i.e., the inter-gate isolation structures GS1, GS2 shown in FIG. 2B). Further, the remained semiconductor sheets/wires form the semiconductor sheets/wires NS exemplarily shown in FIG. 3. Subsequently, the source/drain structures (i.e., the source/drain structures 204, 206, 212, 232, 234, 240, 242 and the dummy source/drain structures 246, 248 as shown in FIG. 2A) are formed at opposite sides of the initial wall structures. In addition, the sacrificial gate structures of the initial wall structures are replaced by the gate structures, and the sacrificial layers are removed during the replacement process. The gate structures and the inter-gate isolation structures form the wall structures W1, W2 shown in FIG. 2B.

Figure 4:
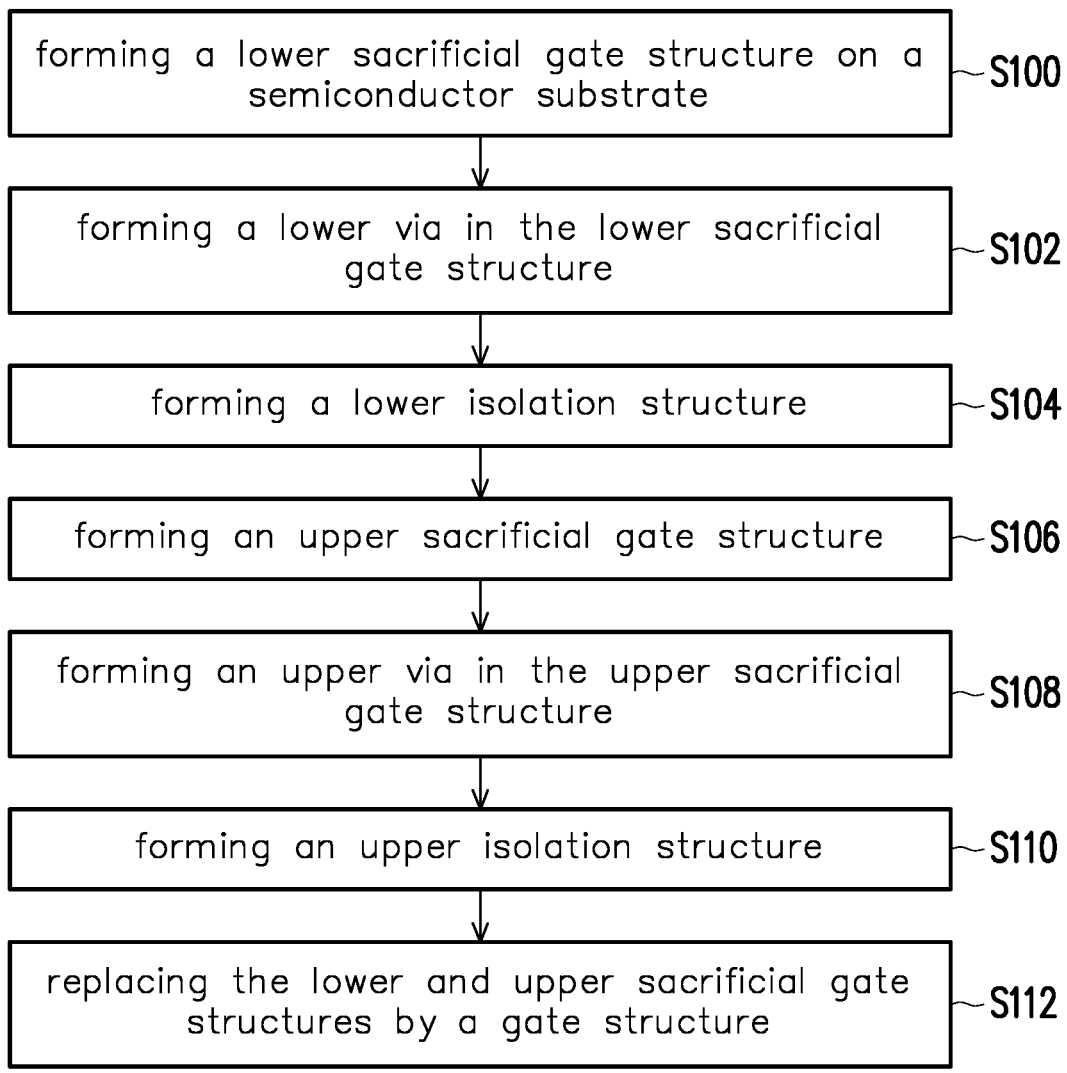
FIG. 4 is a flow diagram illustrating a method for forming the wall structure shown in FIG. 2B according to some embodiments of the present disclosure.

FIG. 4 is a flow diagram illustrating a method for forming the wall structure W1/W2 shown in FIG. 2B according to some embodiments of the present disclosure. FIG. 5A through FIG. 5G are schematic cross-sectional views illustrating structures at various stages during the manufacturing process shown in FIG. 4.

As described above, a method for forming the wall structure W1/W2 shown in FIG. 2B may include forming initial wall structures intersected with some of the stacks each including alternately stacked semiconductor sheets/wires and sacrificial layers, and replacing the sacrificial gate structures in the initial wall structures with the gate structures. For conciseness, such method will be described with reference to FIG. 5A through FIG. 5G without showing the semiconductor sheets/wires and the sacrificial layers.

Figure 5A:
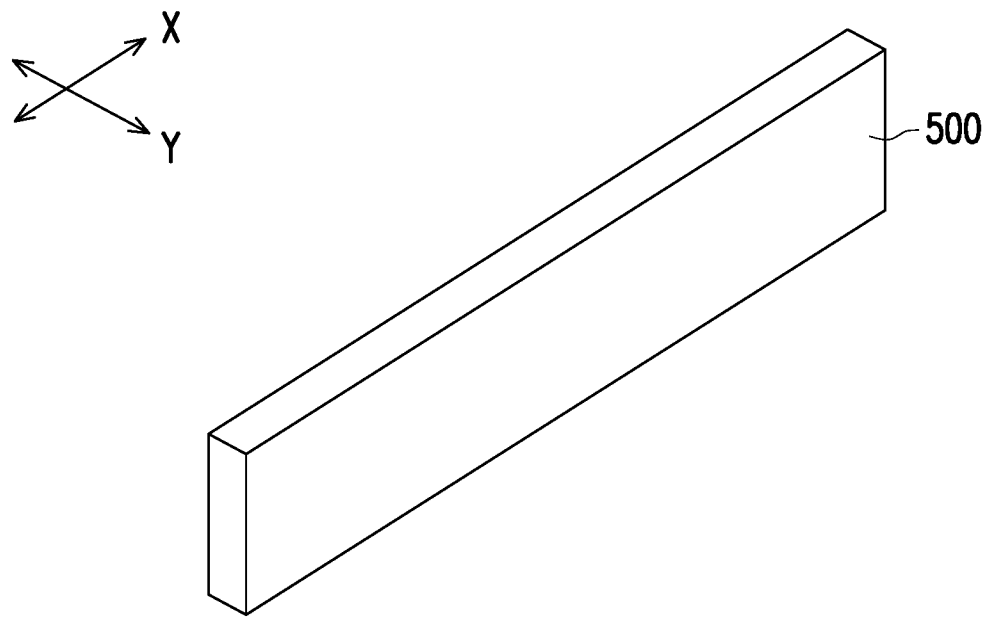
FIG. 5A through FIG. 5G are schematic cross-sectional views illustrating structures at various stages during the manufacturing process shown in FIG. 4.
Figure 5B:
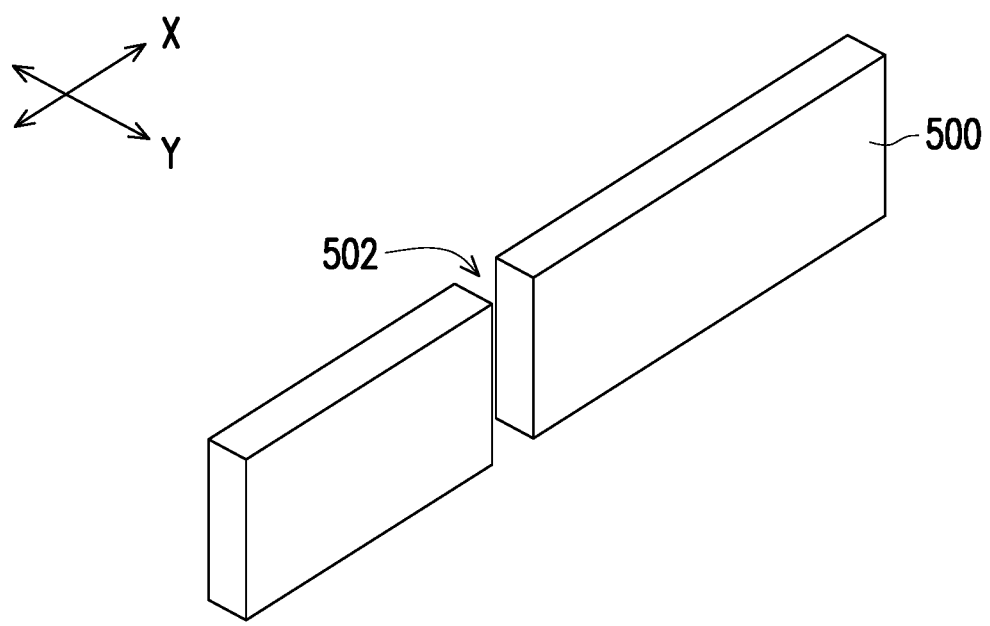

Referring to FIG. 4 and FIG. 5B, step S100 is performed, and a lower sacrificial gate structure 500 is formed on a semiconductor substrate (not shown). The lower sacrificial gate structure 500 is intersected with some of the stacks each including alternately stacked semiconductor sheets/wires and sacrificial layers (not shown), and is formed to a height lower than a height of these stacks. In some embodiments, a method for forming the lower sacrificial gate structure 500 may include a deposition process (e.g., a chemical vapor deposition (CVD) process), a lithography process and an etching process (e.g., an anisotropic etching process). In addition, a material of the lower sacrificial gate structure 500 may include polysilicon.

Referring to FIG. 4 and FIG. 5B, step S102 is performed, and a lower via 502 is formed in the lower sacrificial gate structure 500. The lower via 502 may penetrate through the lower sacrificial gate structure 500, and separate the lower sacrificial gate structure 500 into two separated portions. The lower via 502 defines location of a lower pillar portion of the eventually formed inter-gate isolation structure GS1/GS2 (as shown in FIG. 5G), and the separated portions of the lower sacrificial gate structure 500 will become the gate structures at the ground level of the wall structure W1/W2 after a subsequent gate replacement process. In some embodiments, a method for forming the lower via 502 may include a lithography process and an etching process (e.g., an anisotropic etching process).

Figure 5C:
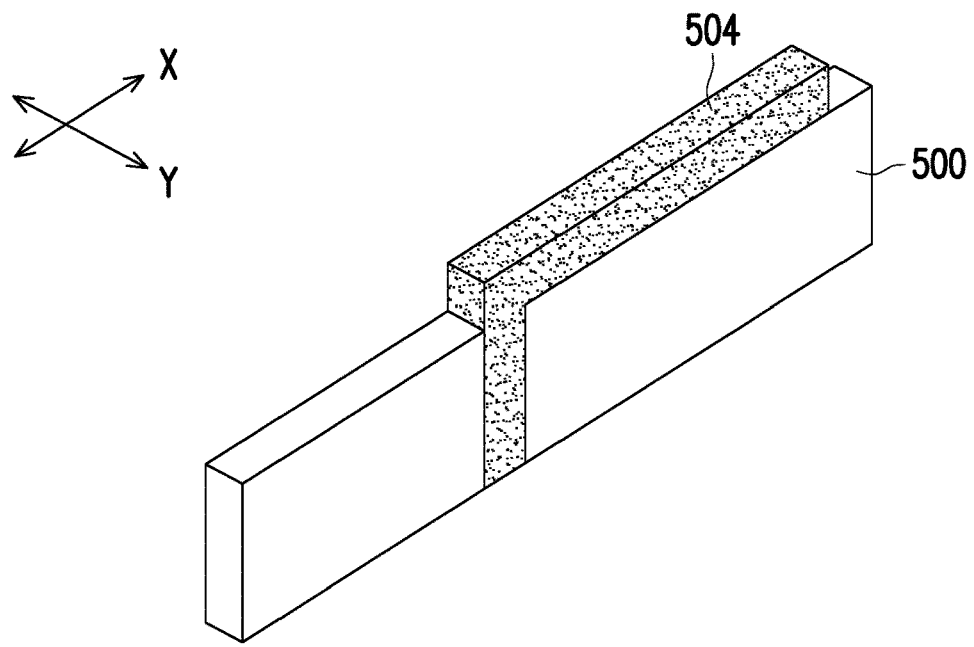

Referring to FIG. 4 and FIG. 5C, step S104 is performed, and a lower isolation structure 504 is formed. The lower isolation structure 504 may fill up the lower via 502, and may laterally extend on a top surface of the lower sacrificial gate structure 500. A portion of the lower isolation structure 504 filling in the lower via 502 may become a lower pillar portion of the eventually formed inter-gate isolation structure GS1/GS2 (as shown in FIG. 5G), and a portion of the lower isolation structure 504 lying on the top surface of the lower sacrificial gate structure 500 may become a laterally lying portion of the eventually formed inter-gate isolation structure GS1/GS2 (as shown in FIG. 5G). In some embodiments, a method for forming the lower isolation structure 504 includes globally forming an insulating material layer on the lower sacrificial gate structure 500 by a deposition process (e.g., a CVD process). This insulating material layer may fill up the lower via 502, and may globally cover the top surface of the lower sacrificial gate structure 500. Subsequently, such insulating material layer may be patterned to form the lower isolation structure 504 by a lithography process and an etching process (e.g., an anisotropic etching process).

Figure 5D:
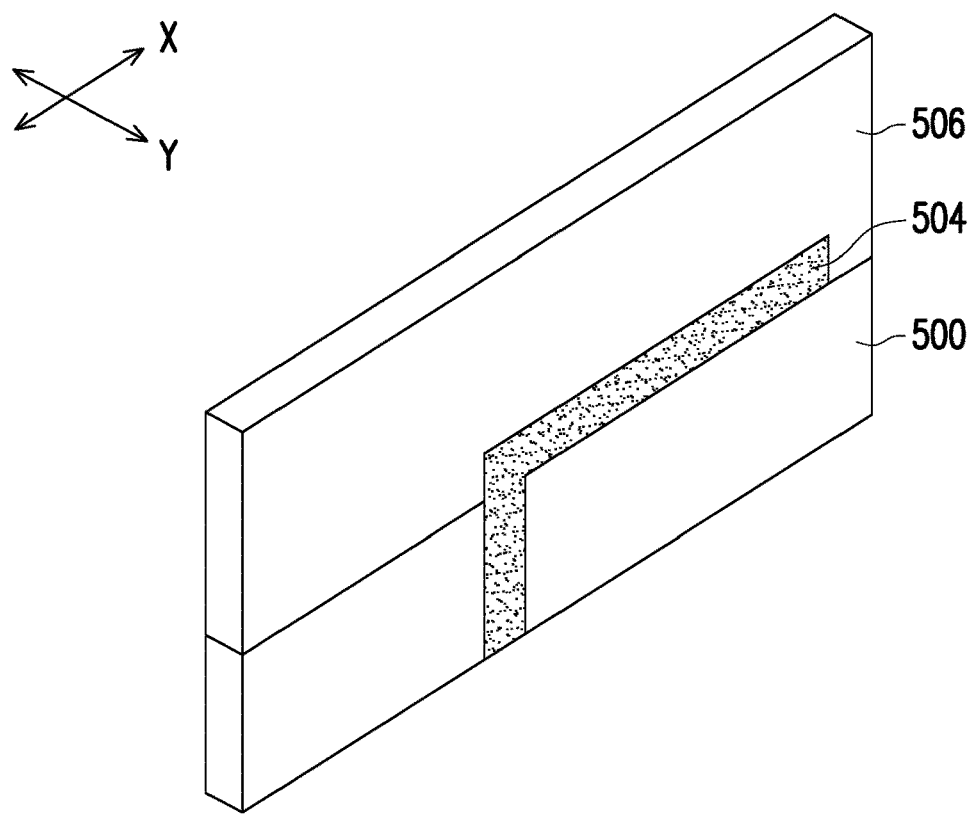

Referring to FIG. 4 and FIG. 5D, step S106 is performed, and an upper sacrificial gate structure 506 is formed. The upper sacrificial gate structure 506 is stacked on the lower sacrificial gate structure 500 and the lower isolation structure 504. In addition, the upper sacrificial gate structure 506 and the lower sacrificial gate structure 500 may extend along the same direction (e.g., the direction X). In some embodiments, sidewalls of the upper sacrificial gate structure 506, the lower isolation structure 504 and the lower sacrificial gate structure 500 are substantially coplanar. As described above, the lower sacrificial gate structure 500 intersects with some stacks each including alternately stacked semiconductor sheets/wires and sacrificial layers (not shown), and covers sidewalls of a lower portion of these stacks. On the other hand, the upper sacrificial gate structure 506 may cover sidewalls and a top surface of an upper portion of these stacks. In some embodiments, a method for forming the upper sacrificial gate structure 506 includes a deposition process (e.g., a CVD process), a lithography process and an etching process (e.g., an anisotropic etching process). In addition, in some embodiments, the lower and upper sacrificial gate structures 500, 506 are made of the same material (e.g., polysilicon).

Figure 5E:
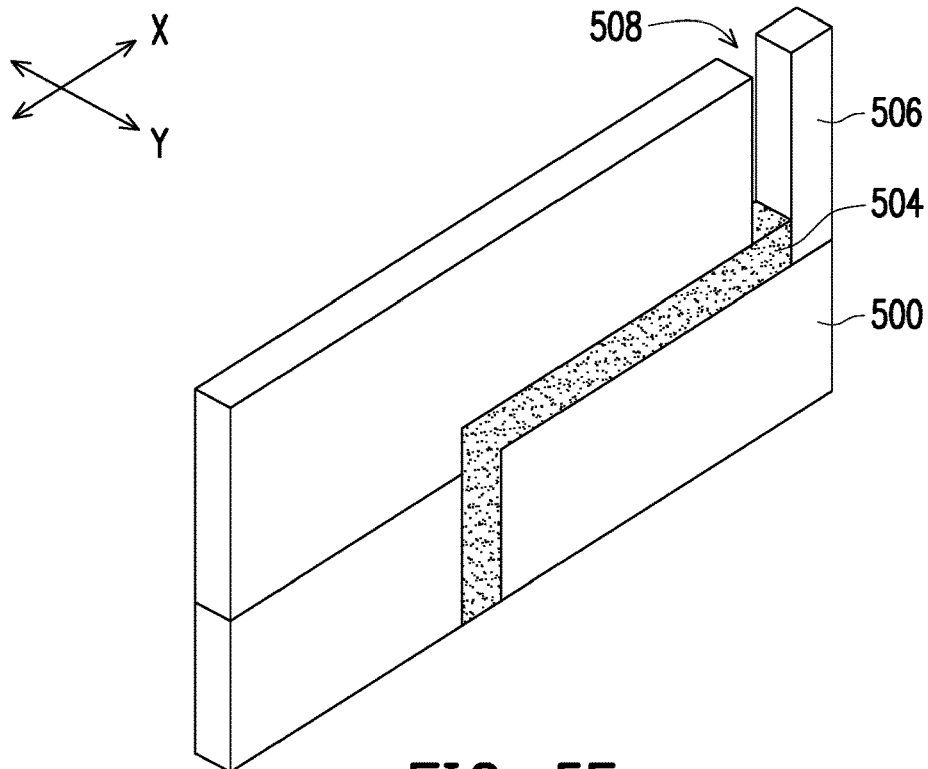

Referring to FIG. 4 and FIG. 5E, step S108 is performed, and an upper via 508 is formed in the upper sacrificial gate structure 506. The upper via 508 penetrates through the upper sacrificial gate structure 506, and exposes a portion of the laterally lying portion of the lower isolation structure 504. In addition, the upper sacrificial gate structure 506 is divided into two portions by the upper via 508. The upper via 508 defines a location of an upper pillar portion of the eventually formed inter-gate isolation structure GS1/GS2 (as shown in FIG. 5G), and the separated portions of the upper sacrificial gate structure 506 may become the gate structures at an elevated level of the wall structure W1/W2 after a subsequent gate replacement process. In some embodiments, a method for forming the upper via 508 may include a lithography process and an etching process (e.g., an anisotropic etching process).

Figure 5F:
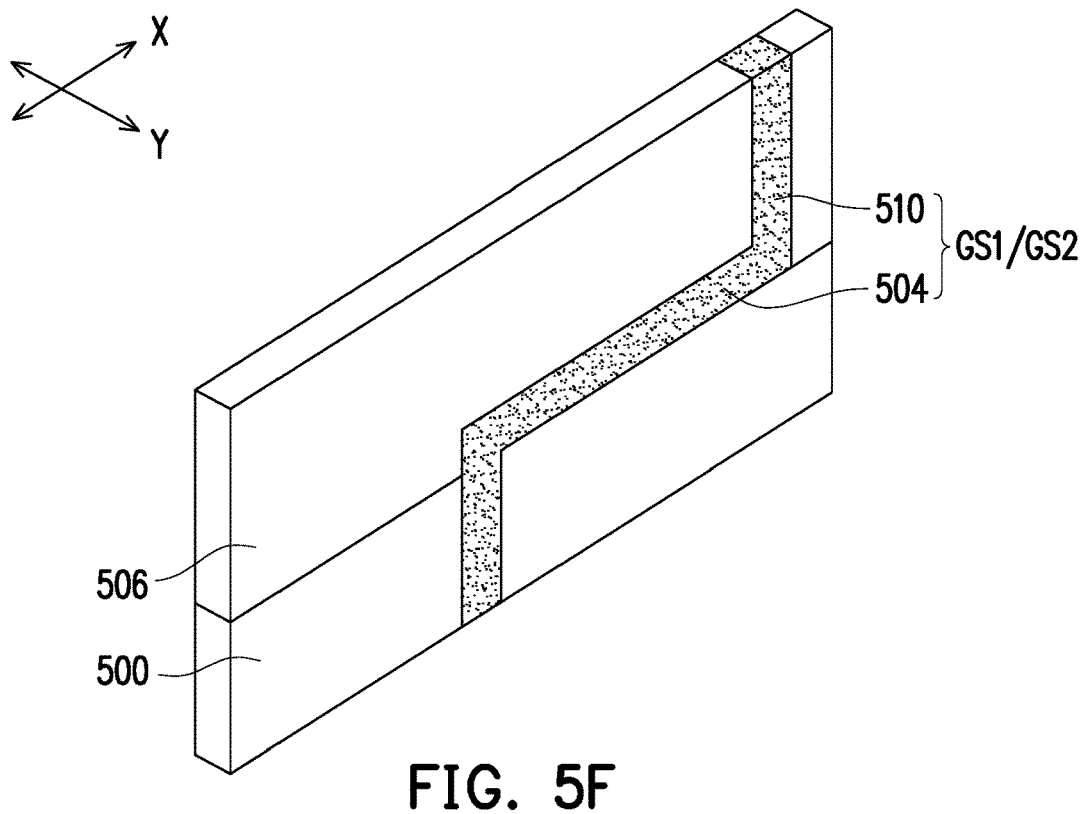
Figure 5G:
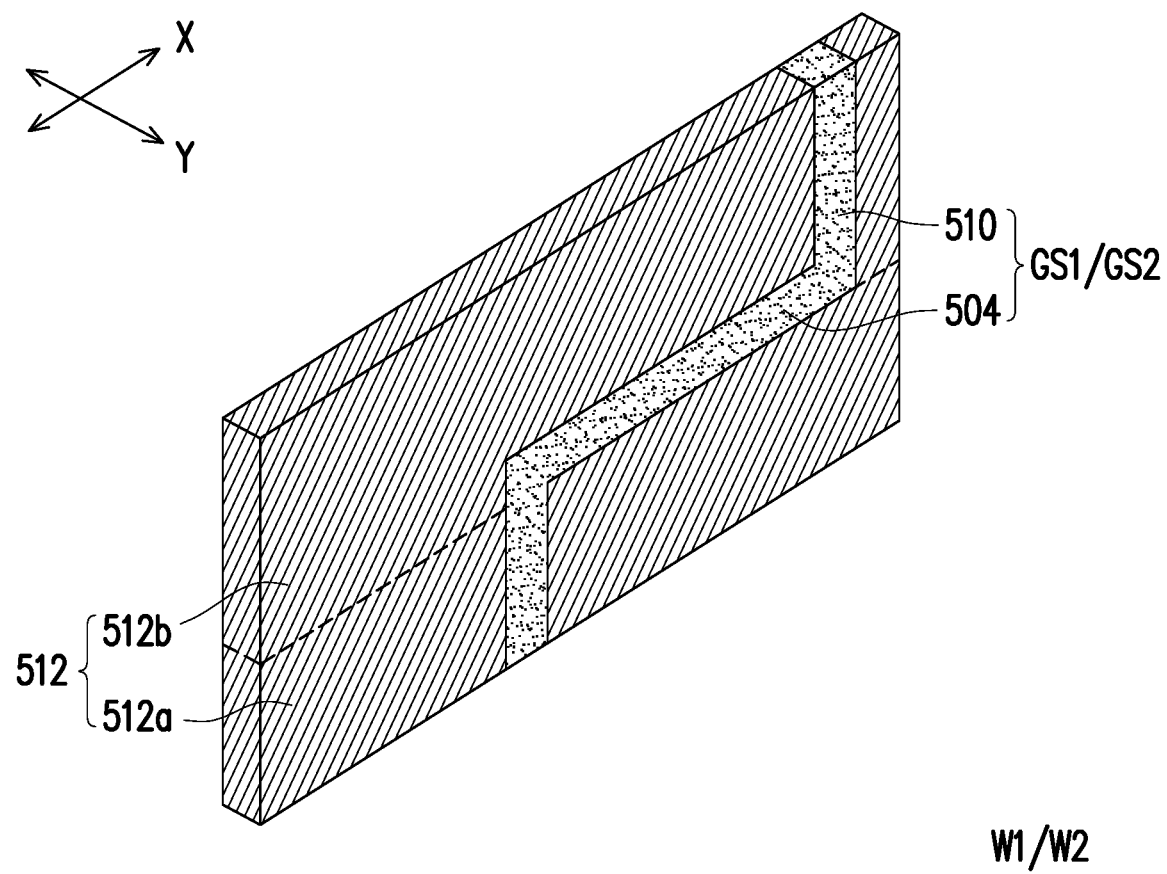

Referring to FIG. 4 and FIG. 5F, step S110 is performed, and an upper isolation structure 510 is formed. The upper isolation structure 510 are filled in the upper via 508, and may be filled to a height substantially aligned with a top surface of the upper sacrificial gate structure 506. In addition, a bottom end of the upper isolation structure 510 is in contact with the laterally lying portion of the lower isolation structure 504. The lower isolation structure 504 and the upper isolation structure 510 collectively form the inter-gate isolation structure GS1/GS2 as described with reference to FIG. 2B. The lower isolation structure 504 includes the lower pillar portion and the laterally lying portion of the inter-gate isolation structure GS1/GS2, while the upper isolation structure 510 is the upper pillar portion of the inter-gate isolation structure GS1/GS2. In some embodiments, a method for forming the upper isolation structure 510 includes filling an insulating material into the upper via 508 by a deposition process (e.g., a CVD process). Subsequently, a planarization process (e.g., an etching process) may be performed to remove portions of the insulating material above a top surface of the upper sacrificial gate structure 506. The remained portion of the insulating material in the upper via 508 forms the upper isolation structure 510.

Referring to FIG. 4 and FIG. 5G, step S112 is performed, and the lower and upper sacrificial gate structures 500, 506 are replaced by a gate structure 512. In addition, the sacrificial layers in the stacks (not shown) wrapped by the lower and upper sacrificial gate structures 500, 506 are also replaced by the gate structure 512 along with the lower and upper sacrificial gate structures 500, 506. Accordingly, the semiconductor sheets/wires used to be alternately stacked with the sacrificial layers are currently wrapped by the gate structure 512. The gate structure 512 has a lower portion 512a and an upper portion 512b. The lower portion 512a is at a ground level, and may be previously occupied by the lower sacrificial gate structure 500 as well as the sacrificial layers (not shown) laterally penetrating through the lower sacrificial gate structure 500. On the other hand, the upper portion 512b is at an elevated level, and may be previously occupied by the upper sacrificial gate structure 506 as well as the sacrificial layers (not shown) laterally penetrating through the upper sacrificial gate structure 506. In some embodiments, a method for forming the gate structure 512 includes removing the lower and upper sacrificial gate structures 500, 506 as well as the sacrificial layers (not shown) by an etching process (e.g., an isotropic etching process). Since the semiconductor sheets/wires alternately stacked with the sacrificial layers (both not shown) have sufficient etching selectivity with respect to the sacrificial layers and the lower and upper sacrificial gate structures 500, 506, the semiconductor sheets/wires can be released during the etching process. Thereafter, a conductive material is filled in the space previously occupied by the lower and sacrificial gate structures 500, 506 as well as the sacrificial layers by a deposition process (e.g., an atomic layer deposition (ALD) process) or a selective growth process, so as to form the gate structure 512. In some embodiments, the conductive material for forming the gate structure 512 includes one or more metallic materials. For instance, the metallic material(s) may include tungsten, titanium, titanium nitride, aluminum or combinations thereof.

Referring to FIG. 2B and FIG. 5G, the lower portion 512a of the gate structure 512 shown in FIG. 5G could include the gate structure 210 and the body portion 216a of the gate structure 216 in the wall structure W1 shown in FIG. 2B, or include the gate structure 224 and the body portion 202a of the gate structure 202 in the wall structure W2 shown in FIG. 2B. In addition, the upper portion 512b of the gate structure 512 shown in FIG. 5G could include the gate structure 230 and the protruding portion 216b of the gate structure 216 in the wall structure W1 shown in FIG. 2B, or include gate structure 238 and the protruding portion 202b of the gate structure 202 in the wall structure W2 shown in FIG. 2B.

Figure 6A:
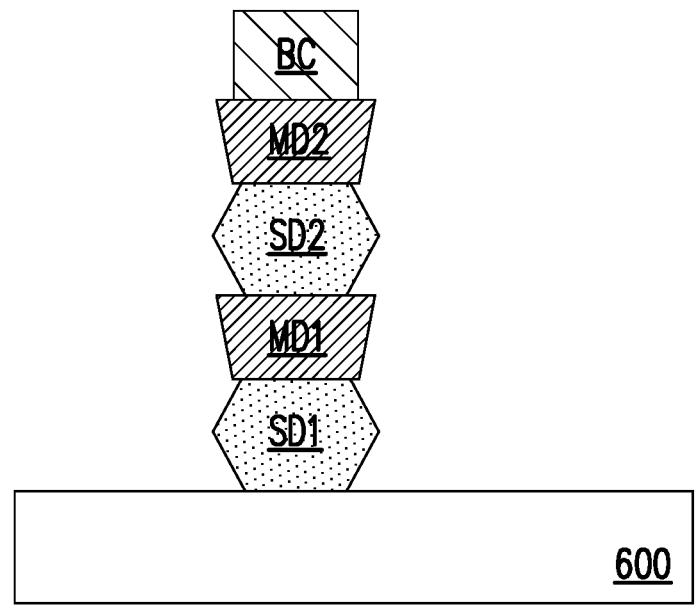
FIG. 6A is a schematic cross-sectional view illustrating a stack of source/drain structures covered by a butted contact in the memory device according to some embodiments of the present disclosure.

FIG. 6A is a schematic cross-sectional view illustrating a stack of source/drain structures covered by a butted contact in the memory device according to some embodiments of the present disclosure.

Referring to FIG. 2A and FIG. 6A, a bottom source/drain structure SD1 shown in FIG. 6A could be the source/drain structure 206 of the pull-down transistor PD1 shown in FIG. 2A, and a top source/drain structure SD2 shown in FIG. 6A could be the source/drain structure 232 of the pull-up transistor PU1 shown in FIG. 2A. Further, a conductive structure MD1 in between the source/drain structures SD1, SD2 shown in FIG. 6A could be the conductive structure MD between the source/drain structures 206, 232 shown in FIG. 2A, and a butted contact BC over the source/drain structure SD2 shown in FIG. 6A could be the butted contact BC2 shown in FIG. 2A. Alternatively, the source/drain structures SD1, SD2 shown in FIG. 6A could be the source/drain structures of the pull-down transistor PD2 and the pull-up transistor PU2 that are covered by the butted contact BC1 shown in FIG. 2A. Accordingly, the butted contact BC shown in FIG. 6A could be the butted contact BC1 shown in FIG. 2A, and the conductive structure MD1 shown in FIG. 6A could be the conductive structure (hidden in FIG. 2A) between these source/drain structures of the pull-down transistor PD2 and the pull-up transistor PU2 shown in FIG. 2A.

As shown in FIG. 6A, the source/drain structures SD1, SD2, the conductive structure MD1 and the butted contact BC are formed on a semiconductor substrate 600, such as a semiconductor wafer or a semiconductor-on-insulator (SOI) wafer. In some embodiments, the source/drain structures SD1, SD2 are epitaxial structures, and may be respectively formed by an epitaxial process. Further, since the source/drain structures SD1, SD2 may be source/drain terminals of transistors having different conductive types (e.g., the pull-down transistor PD1 and the pull-up transistor PU1 as shown in FIG. 2A), the source/drain structures SD1, SD2 may be made of different materials. For instance, a material of the source/drain structure SD1, which may be a source/drain terminal of an N-type transistor, may include silicon carbide, while a material of the source/drain structure SD2, which may be a source/drain terminal of a P-type transistor, may include silicon germanium. Alternatively, the material of the source/drain structure SD1, which may be a source/drain terminal of a P-type transistor, may include silicon germanium, while the material of the source/drain structure SD2, which may be a source/drain terminal of a N-type transistor, may include silicon carbide. On the other hand, in some embodiments, the conductive structure MD1 and the butted contact BC may respectively be made of a metallic material, and a method for forming each of the conductive structure MD1 and the butted contact BC may include a deposition process (e.g., a CVD process or a physical vapor deposition (PVD) process), a plating process or a combination thereof. In these embodiments, the metallic material may include tungsten, titanium, cobalt, the like or combinations thereof.

In some embodiments, another conductive structure MD2 is further disposed between the source/drain structure SD2 and the butted contact BC, and electrically connected to the source/drain structure SD2 and the butted contact BC. The conductive structure MD2 may be similar to the conductive structure MD1 in terms of material and formation method. In other words, the conductive structure MD2 may be made of the afore-mentioned metallic material, and a method for forming the conductive structure MD2 may include a deposition process (e.g., a CVD process or a PVD process), a plating process or a combination thereof.

Figure 6B:
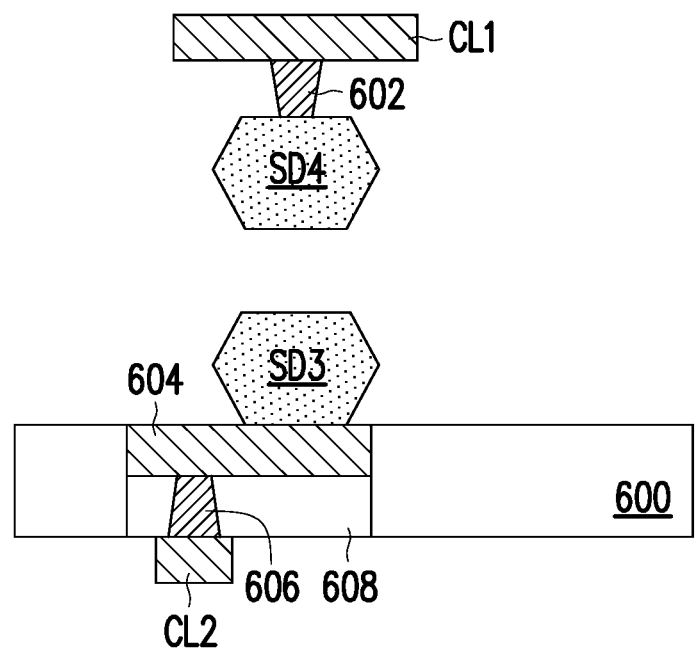
FIG. 6B is a schematic cross-sectional view illustrating a stack of source/drain structures with the bottom source/drain structure being routed to a back side of a semiconductor substrate according to some embodiments of the present disclosure.

FIG. 6B is a schematic cross-sectional view illustrating a stack of source/drain structures with the bottom source/drain structure being routed to a back side of a semiconductor substrate according to some embodiments of the present disclosure.

Referring to FIG. 1B, FIG. 2A and FIG. 6B, a bottom source/drain structure SD3 shown in FIG. 6B could be the source/drain structure 212 of the pull-down transistor PD1 shown in FIG. 2A, and a top source/drain structure SD4 shown in FIG. 6B could be the source/drain structure 234 of the pull-up transistor PU1 shown in FIG. 2A. Alternatively, the source/drain structure SD4 shown in FIG. 6B could be the source/drain structure 242 of the pull-up transistor PU2 shown in FIG. 2A, and the source/drain structure SD3 shown in FIG. 6B could be the source/drain structure 226 of the pull-down transistor PD2 lying below and isolated from the source/drain structure 242 of the pull-up transistor PU2 as shown in FIG. 1B and FIG. 2A. Further, a conductive line CL1 lying over the source/drain structure SD4 shown in FIG. 6B could be the power supply line PL shown in FIG. 1B and FIG. 2A, and a conductive line CL2 at a back side of the semiconductor substrate 600 shown in FIG. 6B could be the reference voltage line GL shown in FIG. 1B and FIG. 2A.

As shown in FIG. 6B, the source/drain structure SD4 is vertically separated and isolated from the underlying source/drain structure SD3 by, for example, a dielectric material (not shown). In addition, in some embodiments, the source/drain structure SD4 may be electrically connected to the overlying conductive line CL1 through a conductive via 602 standing on the source/drain structure SD4. In other embodiments, the conductive line CL1 is further elevated from the source/drain structure SD4, and additional conductive trace(s) and additional conductive via(s) may be further disposed between the conductive line CL1 and the source/drain structure SD4.

On the other hand, the source/drain structure SD3 is routed to the back side of the semiconductor substrate 600. In some embodiments, the source/drain structure SD3 is electrically connected to the conductive line CL2 through routing elements 604, 606 embedded in the semiconductor substrate 600. The routing element 604 may be a conductive trace laterally extending and electrically connected to the source/drain structure SD3, while the routing element 606 may be a conductive via configured to establish vertical conduction path between the routing element 604 and the conductive line CL2. Further, the routing element 606 may be laterally surrounded by a dielectric layer 608.

In some embodiments, formation of the routing elements 604, 606 and the conductive line CL2 may be performed after forming the transistors (i.e., the pass-gate transistors PG1, PG2, the pull-down transistors PD1, PD2 and the pull-up transistors PU1, PU2) as well as the interconnections including the conductive line CL at the front side (i.e., the active side) of the semiconductor substrate 600. In these embodiments, after formation of the transistors and interconnections, the whole structure including the semiconductor substrate 600 may be flipped over, such that the back side of the semiconductor substrate 600 is exposed. Thereafter, the semiconductor substrate 600 may be thinned, and an opening may be formed in the semiconductor substrate 600 for defining a location of the routing element 604 by a lithography process and an etching process (e.g., an anisotropic etching process). Subsequently, a conductive material may be filled in this opening by a deposition process (e.g., a CVD process or a PVD process), a plating process or a combination thereof, in order to form the routing element 604. An etching process may be optionally performed to adjust a thickness of the routing element 604. After formation of the routing element 604, a dielectric material may be formed on an exposed surface of the routing element 604. In addition, a planarization process (e.g., a polishing process, an etching process or a combination thereof) may be performed to remove portions of the dielectric material above the back surface of the semiconductor substrate 600 (i.e., the bottom surface of the semiconductor substrate 600 shown in FIG. 6B). The remained portion of the dielectric material forms the dielectric layer 608. A via is then formed in the dielectric layer 608 by a lithography process and an etching process (e.g., an anisotropic etching process), and a conductive material is filled in the via by a deposition process (e.g., a CVD process or a PVD process), a plating process or a combination thereof. After removing portions of the conductive material outside the via by a planarization process (e.g., a polishing process, an etching process or a combination thereof), and the remained portion of the conductive material forms the routing element 606. Then, the conductive line CL2 and an additional dielectric layer (not shown) may be formed on the routing element 606 by, for example, a damascene process.

It should be noted that, the bit line BL and the bit line bar BLB shown in FIG. 1B and FIG. 2A are respectively similar to the conductive line CL2 described with reference to FIG. 6B in terms of structure, routing and manufacturing method. In addition, the reference voltage line GL, the bit line BL and the bit line bar BLB may be formed in the same plane. Alternatively, at least two of the reference voltage line GL, the bit line BL and the bit line bar BLB may be formed in different planes. On the other hand, the word line WL and the power supply line PL above the pull-up transistors PU1, PU2 as shown in FIG. 2A may be formed in the same plane, or in different planes.

Figure 7:
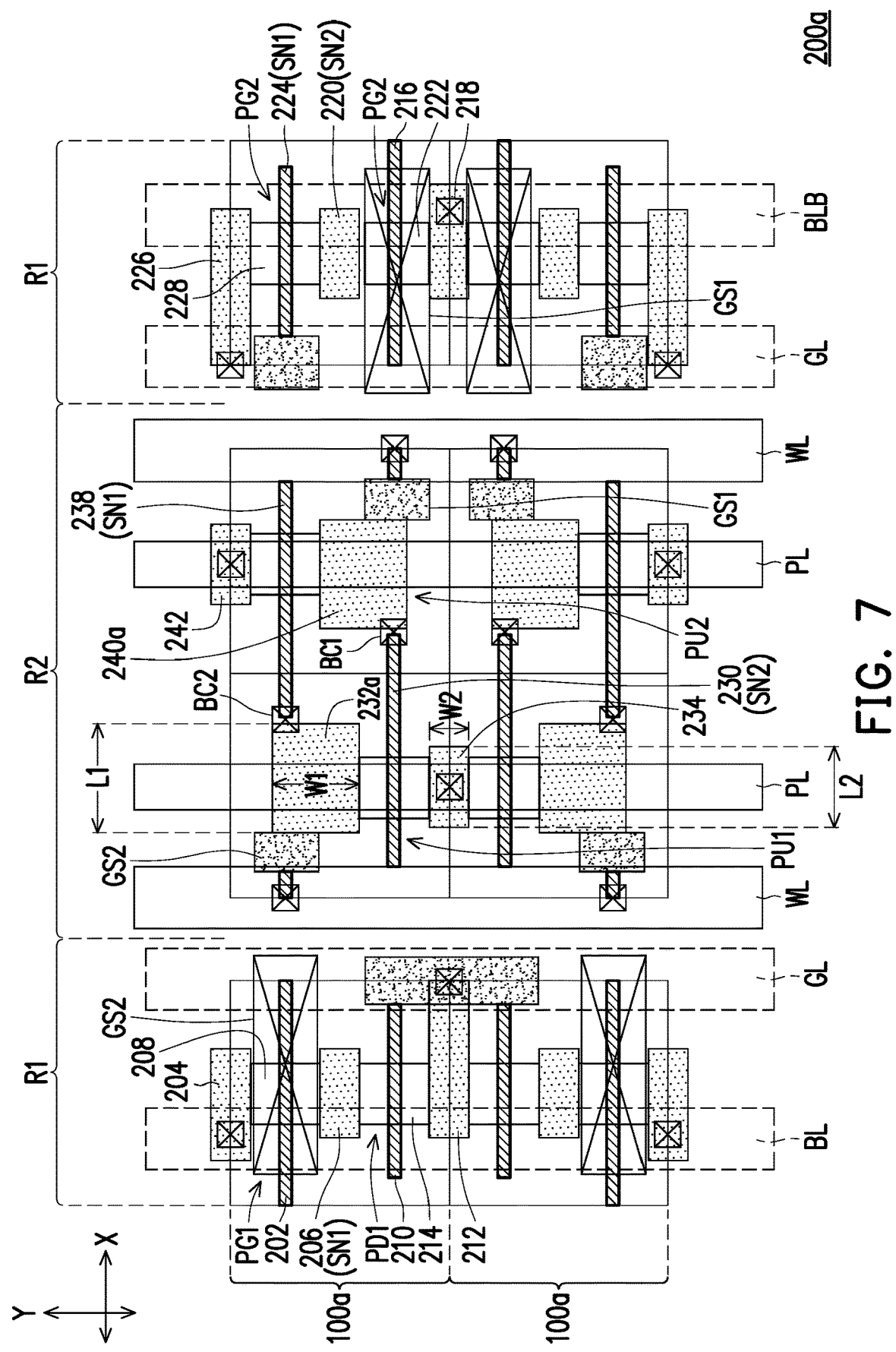
FIG. 7 illustrates a layout of a memory device according to alternative embodiments of the present disclosure.

FIG. 7 illustrates a layout 200a of adjacent memory devices 100a according to alternative embodiments of the present disclosure. The layout 200a and the memory devices 100a shown in FIG. 7 are similar to the layout 200 and the memory devices 100 as described with reference to FIG. 1B. Only difference therebetween will be described, the same or the like parts would not be repeated again.

Referring to FIG. 7, in some embodiments, source/drain structures 232a, 234 of the pull-up transistor PU1 are different in size. The source/drain structure 232a of the pull-up transistor PU1 coupled to the further extended portion of the gate structure 238 of the pull-up transistor PU2 may have a footprint area larger than a footprint area of the other source/drain structure 234 of the pull-up transistor PU1. In some embodiments, a ratio of a width W1 of the source/drain structure 232a along the direction Y with respect to a width W2 of the source/drain structure 234 along the same direction Y ranges from 1.2 to 2. Further, in some embodiments, a ratio of a length L1 of the source/drain structure 232a along the direction X with respect to a length L2 of the source/drain structure 234 along the direction Y ranges from 0.8 to 1.2. By increasing the footprint area of the source/drain structure 232a, an extension length of the gate structure 238 along the direction X can be reduced. As shown in FIG. 7, the gate structure 238 extends to a side of the source/drain structure 232a (e.g., to a right side of the source/drain structure 232a as shown in FIG. 7), rather than further extends along a sidewall of the source/drain structure 232a (e.g., along a top side of the source/drain structure 232a). In addition, a side of the source/drain structure 232a (e.g., a bottom side of the source/drain structure 232a as shown in FIG. 7) faces toward the gate structure 230 of the pull-up transistor PU1, and another side of the source/drain structure 232a (e.g., a right side of the source/drain structure 232a as shown in FIG. 7) faces toward a terminal surface of the gate structure 238 of the pull-up transistor PU2. Further, a footprint area of a butted contact BC2' for bridging the source/drain structure 232a to the further extended portion of the gate structure 238 can be reduced as well. Accordingly, a larger area available for disposing the signal lines (e.g., the word line WL and the power supply line PL) above the transistors (e.g., the pass-gate transistors PG1, PG2, the pull-down transistors PD1, PD2 and the pull-up transistors PU1, PU2) of the memory device 100a can be provided.

Similarly, source/drain structures 240a, 242 of the pull-up transistor PU2 are different in size. The source/drain structure 240a of the pull-up transistor PU2 coupled to the further extended portion of the gate structure 230 of the pull-up transistor PU1 may have a footprint larger than a footprint area of the other source/drain structure 242 of the pull-up transistor PU2. In some embodiments, dimensional ratio of the source/drain structures 240a, 242 of the pull-up transistor PU2 is substantially identical with the dimensional ratio of the source/drain structures 232a, 234 of the pull-up transistor PU1 as described above. By increasing the footprint area of the source/drain structure 240a, an extension length of the gate structure 230 along the direction X can be reduced. As shown in FIG. 7, the gate structure 230 extends to the source/drain structure 240a, rather than further extends along a sidewall of the source/drain structure 240a. In addition, a sidewall of the source/drain structure 240a faces toward the gate structure 238 of the pull-up transistor PU2, and another sidewall of the source/drain structure 240a faces toward a terminal surface of the gate structure 230 of the pull-up transistor PU1. Further, a footprint area of a butted contact BC1' for bridging the source/drain structure 240a to the further extended portion of the gate structure 230 can be reduced as well.

In some embodiments, two of the power supply lines PL are used in the layout 200a. In these embodiments, the source/drain structures 232a, 234 of the pull-up transistor PU1 may be both overlapped with one of the power supply lines PL, and the source/drain structure 240a/242 of the pull-up transistor PU2 may be both overlapped with the other power supply line PL. In addition, in some embodiments, the dummy source/drain structures 246, 248 as described with reference to FIG. 2A are omitted.

As above, the memory device according to embodiments of the present application is a three-dimensional memory device that includes transistors at ground level and transistors at an elevated level. By stacking some of the transistors on others of the transistors, a footprint area of the memory device can be significantly reduced. In addition, in a latch circuit of the memory device, a gate structure of a first pull-up transistor further extends to the vicinity of a second pull-up transistor, such that the gate structure of the first pull-up transistor can be coupled to a source/drain structure of the second pull-up transistor by a single dimensional butted contact. As compared to a two dimensional butted contact, the single dimensional butted contact is easier to be precisely patterned, and may occupy a footprint area much smaller than a footprint area of a two dimensional butted contact. In embodiments where some signal lines extend over the pull-up transistors, a larger area is available for disposing these signal lines by using the single dimensional butted contact. Furthermore, by disposing an inter-gate isolation structure between stacked gate structures, the stacked gate structures can be coupled to different signals.

Moreover, although the semiconductor device according to embodiments are described with reference to a single port SRAM circuit, the semiconductor device may be otherwise used in a dual port SRAM circuit or other memory circuits.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In an aspect of the present disclosure, a memory device is provided. The memory device comprises: a first pull-up transistor, disposed over a semiconductor substrate, and comprising a first gate structure and two first source/drain structures at opposite sides of the first gate structure; and a second pull-up transistor, laterally spaced apart from the first pull-up transistor, and comprising a second gate structure and two second source/drain structures at opposite sides of the second gate structure, wherein the first and second gate structures extend along a first direction and laterally spaced apart from each other along a second direction intersected with the first direction, the first gate structure further extends along a sidewall of one of the second source/drain structures, and the second gate structure further extends along a sidewall of one of the first source/drain structures.

In another aspect of the present disclosure, a memory device is provided. The memory device comprises: a pull-down transistor; a pass-gate transistor, laterally spaced apart from the pull-down transistor; a pull-up transistor, stacked on the pull-down transistor, wherein a gate structure of the pull-up transistor and a gate structure of the pull-down transistor are physically connected to form a first gate structure, an upper part of the first gate structure further extends to be overlapped with a second gate structure of the pass-gate transistor, and an inter-gate isolation structure, extending between the first and second gate structures, and isolating the first and second gate structures from each other.

In yet another aspect of the present disclosure, a memory device is provided. The memory device comprises: a first pull-up transistor, disposed over a semiconductor substrate, and comprising a first gate structure and two first source/drain structures at opposite sides of the first gate structure; and a second pull-up transistor, laterally spaced apart from the first pull-up transistor, and comprising a second gate structure and two second source/drain structures at opposite sides of the second gate structure, wherein widths of the first source/drain structures along a direction intersected with an extending direction of the first and second gate structures are different from each other, widths of the second source/drain structures along the direction are different from each other, the first gate structure further extends to and electrically connects to one of the second source/drain structures with a greater width, and the second gate structure further extends to and electrically connects to one of the first source/drain structures with a greater width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a latch circuit, comprising a first inverter and a second inverter cross-coupled with the first inverter, wherein the first inverter comprises a first pull down transistor and a first pull up transistor, and the second inverter comprises a second pull down transistor and a second pull up transistor,
   wherein the first pull down transistor and the second pull down transistor are disposed at a first height, and the first pull up transistor and the second pull up transistor are disposed at a second height over the first height,
   wherein the first pull up transistor overlaps and shares a first gate structure with the first pull down transistor, and the second pull up transistor overlaps and shares a second gate structure with the second pull down transistor.

2. The memory device according to claim 1, wherein
   an upper part of the first gate structure at the second height has a length greater than a length of a lower part of the first gate structure at the first height, and
   an upper part of the second gate structure at the second height has a length greater than a length of a lower part of the second gate structure at the first height.

3. The memory device according to claim 2, wherein
   source/drain structures of the first pull down transistor are disposed at opposite sides of the lower part of the first gate structure, and source/drain structures of the first pull up transistor are stacked over the source/drain structures of the first pull down transistor and located at opposite sides of the upper part of the first gate structure, and
   source/drain structures of the second pull down transistor are disposed at opposite sides of the lower part of the second gate structure, and source/drain structures of the second pull up transistor are stacked over the source/drain structures of the second pull down transistor and located at opposite sides of the upper part of the second gate structure.

4. The memory device according to claim 3, wherein
   channel structures of the first pull down transistor laterally penetrate through the lower part of the first gate structure,
   channel structures of the first pull up transistor laterally penetrate through the upper part of the first gate structure,
   channel structures of the second pull down transistor laterally penetrate through the lower part of the second gate structure, and
   channel structures of the second pull up transistor laterally penetrate through the upper part of the second gate structure.

5. The memory device according to claim 1, further comprising:
   a first pass-gate transistor, disposed at the first height, and shares a source/drain structure with the first pull down transistor; and
   a second pass-gate transistor, disposed at the first height, and shares a source/drain structure with the second pull down transistor.

6. The memory device according to claim 5, wherein
   a third gate structure of the second pass-gate structure and the first gate structure shared by the first pull down transistor and the first pull up transistor extend along the same direction in a first wall structure, and
   a fourth gate structure of the first pass-gate structure and the second gate structure shared by the second pull down transistor and the second pull up transistor extend along the same direction in a second wall structure.

7. The memory device according to claim 6, wherein the first gate structure and the third gate structure are complementary in shape with each other to form the first wall structure, and the second gate structure and the fourth gate structure are complementary in shape with each other to form the second wall structure.

8. The memory device according to claim 7, wherein the first gate structure and the third gate structure are respectively formed in a L-shape, and the second gate structure and the fourth gate structure are respectively formed in a L-shape as well.

9. The memory device according to claim 8, wherein an upper part of the first gate structure at the second height extends over and along a lower part of the third gate structure at the first height, and an upper part of the second gate structure at the second height extends over and along a lower part of the fourth gate at the first height.

10. The memory device according to claim 6, wherein the first wall structure further comprises a first inter-gate isolation structure extending in between the first gate structure and the third gate structure, and the second wall structure further comprises a second inter-gate isolation structure extending in between the second gate structure and the fourth gate structure.

11. The memory device according to claim 10, wherein the first and second inter-gate isolation structures each extend from the first height to the second height.

12. A memory device, comprising:
a first pull down transistor;
a first pull up transistor, stacked on the first pull down transistor, wherein the first pull down transistor and the first pull up transistor share a first gate structure, and a source/drain structure of the first pull down transistor is overlapped with and electrically connected to a source/drain structure of the first pull up transistor;
a second pull down transistor, laterally spaced apart from the first pull down transistor;
a second pull up transistor, stacked on the second pull down transistor, wherein the second pull down transistor and the second pull up transistor share a second gate structure, and a source/drain structure of the second pull down transistor is overlapped with and electrically connected to a source/drain structure of the second pull up transistor;
a first butted contact, connecting the first gate structure to the source/drain structure of the second pull up transistor from above; and
a second butted contact, connecting the second gate structure to the source/drain structure of the first pull up transistor from above.

13. The memory device according to claim 12, wherein the other source/drain structure of the first pull down transistor and the other source/drain structure of the second pull down transistor are connected to an underlying reference voltage line.

14. The memory device according to claim 12, wherein the other source/drain structure of the first pull up transistor and the other source/drain structure of the second pull up transistor are connected to an overlying power supply line.

15. The memory device according to claim 12, further comprising:
a first pass-gate transistor, adjacent to the first pull down transistor, wherein the source/drain structure of the first pull down transistor is shared with the first pass-gate transistor; and
a second pass-gate transistor, adjacent to the second pull down transistor, wherein the source/drain structure of the second pull down transistor is shared with the second pass-gate transistor,
wherein a third gate structure of the second pass-gate transistor is complementary in shape with the first gate structure to form a first wall structure, and a fourth gate structure of the first pass-gate transistor is complementary in shape with the second gate structure to form a second wall structure.

16. The memory device according to claim 15, wherein the other source/drain structure of the first pass-gate transistor is connected to an underlying first bit line, the other source/drain structure of the second pass-gate transistor is connected to an underlying second bit line, and
the third and fourth gate structures are connected to an overlying word line.

17. A memory device, comprising:
a first pull-up transistor, disposed over a semiconductor substrate, and comprising a first gate structure and two first source/drain structures at opposite sides of the first gate structure; and
a second pull-up transistor, laterally spaced apart from the first pull-up transistor, and comprising a second gate structure and two second source/drain structures at opposite sides of the second gate structure,
wherein widths of the first source/drain structures along a direction intersected with an extending direction of the first and second gate structures are different from each other, widths of the second source/drain structures along the direction are different from each other, the first gate structure further extends to and electrically connects to one of the second source/drain structures with a greater width, and the second gate structure further extends to and electrically connects to one of the first source/drain structures with a greater width.

18. The memory device according to claim 17, wherein
a sidewall of the one of the first source/drain structures faces toward a sidewall of the first gate structure, and another sidewall of the one of the first source/drain structures faces toward a terminal surface of the second gate structure; and
a sidewall of the one of the second source/drain structures faces toward a sidewall of the second gate structure, and another sidewall of the one of the second source/drain structures faces toward a terminal surface of the first gate structure.

19. The memory device according to claim 17, wherein the first and second pull-up transistors are elevated from the semiconductor substrate.

20. The memory device according to claim 17, further comprising:
a first butted contact, disposed over the first and second pull-up transistors, and electrically connected to the first gate structure and the one of the second source/drain structures with a greater width; and
a second butted contact, disposed over the first and second pull-up transistors, and electrically connected to the second gate structure and the one of the first source/drain structures with a greater width.

* * * * *